United States Patent
Roumi

(10) Patent No.: US 9,991,492 B2
(45) Date of Patent: Jun. 5, 2018

(54) SEPARATOR ENCLOSURES FOR ELECTRODES AND ELECTROCHEMICAL CELLS

(71) Applicant: CALIFORNIA INSTITUTE OF TECHNOLOGY, Pasadena, CA (US)

(72) Inventor: Farshid Roumi, Irvine, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 194 days.

(21) Appl. No.: 14/546,472

(22) Filed: Nov. 18, 2014

(65) Prior Publication Data

US 2015/0180000 A1 Jun. 25, 2015

Related U.S. Application Data

(60) Provisional application No. 61/905,678, filed on Nov. 18, 2013, provisional application No. 61/938,794, (Continued)

(51) Int. Cl.
| | |
|---|---|
| *H01M 4/96* | (2006.01) |
| *H01M 4/86* | (2006.01) |
| *H01M 2/16* | (2006.01) |
| *H01M 10/42* | (2006.01) |
| *H01M 10/48* | (2006.01) |
| *G01R 31/36* | (2006.01) |
| *H01M 10/052* | (2010.01) |

(52) U.S. Cl.
CPC ........ *H01M 2/1673* (2013.01); *G01R 31/361* (2013.01); *G01R 31/362* (2013.01); *G01R 31/3624* (2013.01); *H01M 2/1686* (2013.01); *H01M 10/4235* (2013.01); *H01M 10/4257* (2013.01); *H01M 10/48* (2013.01); *H01M 10/052* (2013.01)

(58) Field of Classification Search
None
See application file for complete search history.

(56) References Cited

U.S. PATENT DOCUMENTS

| | | |
|---|---|---|
| 528,647 A | 11/1894 | Reed |
| 990,069 A | 4/1911 | Sessions |
| (Continued) | | |

FOREIGN PATENT DOCUMENTS

| | | |
|---|---|---|
| CN | 1555588 | 12/2004 |
| CN | 1670989 | 9/2005 |
| (Continued) | | |

OTHER PUBLICATIONS

Angulakshmi et al. (Aug. 23, 2013) "MgAl2SiO6-incorporated poly(ethylene oxide)-based electrolytes for all-solid-state lithium Batteries," Ionics. 20:151-156.
(Continued)

*Primary Examiner* — Yoshitoshi Takeuchi
(74) *Attorney, Agent, or Firm* — Lathrop Gage LLP

(57) ABSTRACT

The disclosure provides electrochemical cells including a separator enclosure which encloses at least a portion of a positive or negative electrode. In an embodiment, the separator generates a contact force or pressure on at least a portion of the electrode which can improve the performance of the cell. The disclosure also provides methods for charging an electrochemical cell.

22 Claims, 3 Drawing Sheets

Related U.S. Application Data filed on Feb. 12, 2014, provisional application No. 61/985,204, filed on Apr. 28, 2014, provisional application No. 62/024,104, filed on Jul. 14, 2014.

(56) References Cited

U.S. PATENT DOCUMENTS

| | | | |
|---|---|---|---|
| 2,673,230 A | 3/1954 | Brennan | |
| 3,168,458 A | 2/1965 | Sprague | |
| 3,275,478 A | 9/1966 | Rosser et al. | |
| 3,342,717 A | 9/1967 | Leduc | |
| 3,351,495 A * | 11/1967 | Wayne | H01M 2/1653 |
| | | | 210/500.36 |
| 3,607,422 A | 9/1971 | Moran | |
| 3,639,173 A | 2/1972 | Stachurski | |
| 3,970,472 A | 7/1976 | Steffensen | |
| 3,972,795 A | 8/1976 | Goens et al. | |
| 4,041,211 A | 8/1977 | Wiacek | |
| 4,052,539 A | 10/1977 | Shropshire et al. | |
| 4,346,152 A | 8/1982 | Sammells et al. | |
| 4,349,614 A | 9/1982 | Werth et al. | |
| 4,438,185 A | 3/1984 | Taskier | |
| 4,786,567 A | 11/1988 | Skyllas-Kazacos et al. | |
| 4,871,428 A | 10/1989 | Misra et al. | |
| 4,981,672 A | 1/1991 | De Neufville et al. | |
| 5,089,455 A | 2/1992 | Ketcham et al. | |
| 5,227,260 A * | 7/1993 | Rose | H01M 2/02 |
| | | | 429/130 |
| 5,384,211 A * | 1/1995 | Choi | H01M 10/16 |
| | | | 29/623.5 |
| 5,487,959 A | 1/1996 | Koksbang | |
| 5,510,209 A | 4/1996 | Abraham et al. | |
| 5,554,464 A | 9/1996 | Stempin et al. | |
| 5,601,951 A | 2/1997 | Johnson et al. | |
| 5,714,283 A | 2/1998 | Briscoe et al. | |
| 5,952,120 A | 9/1999 | Yu et al. | |
| 6,074,776 A | 6/2000 | Mao et al. | |
| 6,096,456 A | 8/2000 | Takeuchi et al. | |
| 6,146,786 A | 11/2000 | Stadnick et al. | |
| 6,306,540 B1 | 10/2001 | Hiroi et al. | |
| 6,335,115 B1 | 1/2002 | Meissner | |
| 6,372,379 B1 | 4/2002 | Samil et al. | |
| 6,383,675 B1 | 5/2002 | Zhong | |
| 6,432,586 B1 | 8/2002 | Zhang | |
| 6,444,339 B1 | 9/2002 | Eshraghi | |
| 6,447,958 B1 | 9/2002 | Shinohara et al. | |
| 6,489,055 B1 | 12/2002 | Ichihashi et al. | |
| 6,602,593 B1 | 8/2003 | Callahan et al. | |
| 6,770,401 B1 | 8/2004 | Clough | |
| 6,781,817 B2 | 8/2004 | Andelman | |
| 6,830,849 B2 | 12/2004 | Lee et al. | |
| 6,852,446 B2 | 2/2005 | Barbarich | |
| 6,869,727 B2 | 3/2005 | Slezak | |
| 7,282,295 B2 | 10/2007 | Visco et al. | |
| 7,282,296 B2 | 10/2007 | Visco et al. | |
| 7,390,591 B2 | 6/2008 | Visco et al. | |
| 7,425,387 B2 | 9/2008 | Bohnstedt | |
| 7,553,584 B2 | 6/2009 | Chiang et al. | |
| 7,618,748 B2 | 11/2009 | Nathan et al. | |
| 7,642,012 B2 | 1/2010 | Djian et al. | |
| 7,662,510 B2 | 2/2010 | Zhang | |
| 7,811,507 B2 | 10/2010 | Wechs et al. | |
| 7,846,571 B2 | 12/2010 | Christensen et al. | |
| 7,951,480 B1 | 5/2011 | Skinlo et al. | |
| 7,985,337 B2 | 7/2011 | Heuser et al. | |
| 8,017,260 B2 | 9/2011 | Kaneta et al. | |
| 8,048,556 B2 | 11/2011 | Davis et al. | |
| 8,110,301 B2 | 2/2012 | Iacovangelo et al. | |
| 8,119,269 B2 | 2/2012 | Ramasubramanian et al. | |
| 8,119,273 B1 | 2/2012 | Gerald, II et al. | |
| 8,202,649 B2 | 6/2012 | Visco et al. | |
| 8,216,712 B1 | 7/2012 | Ramasubramanian et al. | |
| 8,288,034 B2 | 10/2012 | Davis et al. | |
| 8,697,290 B2 | 4/2014 | Babinec et al. | |
| 8,703,356 B2 | 4/2014 | Hayashi | |
| 9,379,368 B2 | 6/2016 | Roumi | |
| 9,658,292 B2 | 5/2017 | Roumi et al. | |
| 9,831,043 B2 | 11/2017 | Roumi et al. | |
| 2001/0041295 A1 | 11/2001 | Vallee et al. | |
| 2002/0150818 A1 | 10/2002 | Amatucci et al. | |
| 2002/0160263 A1 | 10/2002 | Corrigan et al. | |
| 2003/0013015 A1 | 1/2003 | Martin et al. | |
| 2003/0096147 A1 | 5/2003 | Badding et al. | |
| 2003/0099884 A1 | 5/2003 | Chiang et al. | |
| 2004/0011661 A1 | 1/2004 | Bradford et al. | |
| 2004/0018431 A1 | 1/2004 | Gozdz et al. | |
| 2004/0126653 A1 | 7/2004 | Visco et al. | |
| 2004/0175626 A1 | 9/2004 | Dasgupta et al. | |
| 2004/0234862 A1 | 11/2004 | MacGlashan et al. | |
| 2004/0241540 A1 | 12/2004 | Tsutsumi et al. | |
| 2005/0074671 A1 | 4/2005 | Sugiyama et al. | |
| 2005/0095504 A1 | 5/2005 | Kim et al. | |
| 2005/0175894 A1 | 8/2005 | Visco et al. | |
| 2005/0186469 A1 | 8/2005 | De Jonghe et al. | |
| 2005/0208383 A1 | 9/2005 | Totsuka et al. | |
| 2006/0121342 A1 | 6/2006 | Sano et al. | |
| 2006/0154141 A1 | 7/2006 | Salot et al. | |
| 2007/0059584 A1 | 3/2007 | Nakano et al. | |
| 2007/0117000 A1 | 5/2007 | An et al. | |
| 2007/0141432 A1 | 6/2007 | Wang et al. | |
| 2007/0166617 A1 | 7/2007 | Gozdz et al. | |
| 2007/0190427 A1 | 8/2007 | Carlson et al. | |
| 2007/0212603 A1 | 9/2007 | Nathan et al. | |
| 2008/0057389 A1 | 3/2008 | Kono et al. | |
| 2008/0057399 A1 | 3/2008 | Visco et al. | |
| 2008/0107958 A1 * | 5/2008 | Kliatzkin | H01M 2/0257 |
| | | | 429/129 |
| 2008/0113261 A1 | 5/2008 | De Jonghe et al. | |
| 2008/0153000 A1 | 6/2008 | Salot et al. | |
| 2008/0241664 A1 | 10/2008 | Nanjundaswamy et al. | |
| 2008/0268327 A1 | 10/2008 | Gordon et al. | |
| 2008/0274394 A1 | 11/2008 | Schormann et al. | |
| 2009/0035664 A1 | 2/2009 | Chiang et al. | |
| 2009/0087728 A1 | 4/2009 | Less et al. | |
| 2009/0087730 A1 | 4/2009 | Kondo et al. | |
| 2009/0189567 A1 | 7/2009 | Joshi et al. | |
| 2009/0197170 A1 | 8/2009 | Viavattine | |
| 2009/0208834 A1 | 8/2009 | Ramasubramanian et al. | |
| 2009/0214956 A1 | 8/2009 | Prieto et al. | |
| 2010/0047671 A1 | 2/2010 | Chiang et al. | |
| 2010/0090650 A1 | 4/2010 | Yazami et al. | |
| 2010/0129699 A1 | 5/2010 | Mikhaylik et al. | |
| 2010/0203372 A1 | 8/2010 | Kim et al. | |
| 2010/0266907 A1 | 10/2010 | Yazami | |
| 2011/0027648 A1 | 2/2011 | Long et al. | |
| 2011/0065009 A1 | 3/2011 | Lascaud et al. | |
| 2011/0097623 A1 | 4/2011 | Marinis et al. | |
| 2011/0104521 A1 | 5/2011 | Kishimoto et al. | |
| 2011/0117416 A1 | 5/2011 | Arora et al. | |
| 2011/0123850 A1 | 5/2011 | Duong et al. | |
| 2011/0123875 A1 | 5/2011 | Issaev et al. | |
| 2011/0143207 A1 | 6/2011 | Arora et al. | |
| 2011/0143217 A1 | 6/2011 | Arora et al. | |
| 2011/0151332 A1 | 6/2011 | Morgan et al. | |
| 2011/0159373 A1 | 6/2011 | Conner et al. | |
| 2011/0159374 A1 | 6/2011 | Conner et al. | |
| 2011/0171514 A1 | 7/2011 | Nishikawa et al. | |
| 2011/0171518 A1 | 7/2011 | Dunn et al. | |
| 2011/0183186 A1 | 7/2011 | Klootwijk et al. | |
| 2011/0197435 A1 | 8/2011 | Kaneko et al. | |
| 2011/0217585 A1 | 9/2011 | Wang et al. | |
| 2011/0217586 A1 | 9/2011 | Kim et al. | |
| 2011/0217588 A1 | 9/2011 | Roh et al. | |
| 2011/0227243 A1 | 9/2011 | Kepler et al. | |
| 2011/0236744 A1 | 9/2011 | Kim et al. | |
| 2011/0256443 A1 | 10/2011 | Park et al. | |
| 2011/0281176 A1 | 11/2011 | Seymour | |
| 2011/0293976 A1 | 12/2011 | Chiba et al. | |
| 2012/0015229 A1 | 1/2012 | Ohashi et al. | |
| 2012/0015232 A1 | 1/2012 | Teshima et al. | |
| 2012/0028101 A1 | 2/2012 | Ishihara et al. | |
| 2012/0034508 A1 | 2/2012 | Davis et al. | |
| 2012/0043940 A1 | 2/2012 | Affinito et al. | |
| 2012/0077095 A1 | 3/2012 | Roumi et al. | |

(56) References Cited

U.S. PATENT DOCUMENTS

| | | |
|---|---|---|
| 2012/0094188 A1 | 4/2012 | Visco et al. |
| 2012/0094194 A1 | 4/2012 | Visco et al. |
| 2012/0119155 A1 | 5/2012 | Liu et al. |
| 2012/0183868 A1 | 7/2012 | Tousaint et al. |
| 2012/0219842 A1 | 8/2012 | Visco et al. |
| 2012/0244412 A1 | 9/2012 | Pascaly et al. |
| 2012/0263986 A1 | 10/2012 | Fulop et al. |
| 2012/0270088 A1 | 10/2012 | Huang et al. |
| 2012/0270112 A1 | 10/2012 | Visco et al. |
| 2013/0017432 A1 | 1/2013 | Roumi |
| 2013/0130131 A1 | 5/2013 | Johnson et al. |
| 2013/0189592 A1 | 7/2013 | Roumi et al. |
| 2013/0224632 A1 | 8/2013 | Roumi |
| 2013/0260205 A1 | 10/2013 | Kwon et al. |
| 2014/0205883 A1 | 7/2014 | Wang et al. |
| 2014/0272500 A1 | 9/2014 | Roumi et al. |
| 2014/0272533 A1 | 9/2014 | Shi et al. |
| 2014/0329120 A1 | 11/2014 | Cui et al. |
| 2015/0171398 A1 | 6/2015 | Roumi |
| 2015/0357635 A1 | 12/2015 | Jito et al. |
| 2016/0013463 A1 | 1/2016 | Roumi et al. |
| 2016/0254514 A1 | 9/2016 | Roumi |
| 2017/0315178 A1 | 11/2017 | Roumi et al. |

FOREIGN PATENT DOCUMENTS

| | | |
|---|---|---|
| CN | 1726608 | 1/2006 |
| CN | 101641815 | 2/2010 |
| CN | 101809801 | 8/2010 |
| CN | 102117905 | 7/2011 |
| CN | 103647107 | 3/2014 |
| EP | 1 271 673 | 1/2003 |
| EP | 2 639 855 | 9/2013 |
| GB | 320916 | 10/1929 |
| JP | S40-001456 | 1/1965 |
| JP | S49-122476 | 10/1974 |
| JP | S62-291871 | 12/1987 |
| JP | S63-155552 | 6/1988 |
| JP | H08-236093 | 9/1996 |
| JP | H09-092254 | 4/1997 |
| JP | H09-153354 | 6/1997 |
| JP | H10-106521 | 4/1998 |
| JP | 2005-525674 | 8/2005 |
| JP | 2005-259566 | 9/2005 |
| JP | 2005-268095 | 9/2005 |
| JP | 2006-019146 | 1/2006 |
| JP | 2006-503416 | 1/2006 |
| JP | 2006-066355 | 3/2006 |
| JP | 2006-185917 | 7/2006 |
| JP | 2006-286427 | 10/2006 |
| JP | 2008-159589 | 7/2008 |
| JP | 2009-105063 | 5/2009 |
| JP | 2010-238421 | 10/2010 |
| JP | 2010-534389 | 11/2010 |
| JP | 2011-512010 | 4/2011 |
| JP | 2011-124104 | 6/2011 |
| JP | 2011-222215 | 11/2011 |
| KR | 10-1375422 | 3/2014 |
| WO | WO 1997/006569 | 2/1997 |
| WO | WO 2003/012908 | 2/2003 |
| WO | WO 2008/019398 | 2/2008 |
| WO | WO 2008/049040 | 4/2008 |
| WO | WO 2008/153749 | 12/2008 |
| WO | WO 2010/007579 | 1/2010 |
| WO | WO 2010/054261 | 5/2010 |
| WO | WO 2010/062391 | 6/2010 |
| WO | WO 2011/070712 | 6/2011 |
| WO | WO 2012/034042 | 3/2012 |
| WO | WO 2013/009750 | 1/2013 |
| WO | WO 2013/154623 | 10/2013 |
| WO | WO 2014/119274 | 8/2014 |
| WO | WO 2014/119275 | 8/2014 |
| WO | WO 2014/152650 | 9/2014 |
| WO | WO 2014/156891 | 10/2014 |
| WO | WO 2015/074037 | 5/2015 |
| WO | WO 2015/074065 | 5/2015 |
| WO | WO 2015/157339 | 10/2015 |

OTHER PUBLICATIONS

Arora et al. (2004) "Battery Separators." Chem. Rev. 104:4419-4462.

Aurbach et al. (2002) "A short review of failure mechanisms of lithium metal and lithiated graphite anodes in liquid electrolyte solutions." Solid State Ionics. 148:405-416.

Bruce et al. (Dec. 15, 2012) "Li—O2 and Li—S Batteries with High Energy Storage," Nature Materials. 11:19-29.

Cheng et al. (Jan. 17, 2012) "Metal-Air Batteries: From Oxygen Reduction Electrochemistry to Cathode Catalysts," Chem. Soc. Rev. 41:2172-2192.

Christensen et al. (Dec. 29, 2011) "A Critical Review of Li/Air Batteries," J. Electrochem. Soc. 159(2):R1-R30.

Croce et al. (2001) "Role of the ceramic fillers in enhancing the transport properties of composite polymer electrolytes," Electrochimica Acta. 46:2457-2461.

Duduta et al. (2011) "Semi-Solid Lithium Rechargeable Flow Battery," Advanced Energy Materials. 1(4):511-516.

Goodenough (May 8, 2012) "Rechargeable Batteries: Challenges Old and New," J. Solid State Electrochem. 16:2019-2029.

Gowda et al. (Feb. 7, 2012) "3D Nanoporous Nanowire Current Collectors for Thin Film Microbatteries," Nano. Lett. 12(3):1198-1202.

Hamelet et al. (Jul. 20, 2012) "Non-aqueous Li-Based Redox Flow Batteries," J. Electrochem. Soc. 159(8):A1360-A1367.

Jung et al. (Jun. 10, 2012) "An Improved High-Performance Lithium-Air Battery," Nature Chemistry. 4:579-585.

Kichambare et al. (Jan. 2012) "Mesoporous Nitrogen-Doped Carbon-Glass Ceramic for Solid-State Lithium-Oxygen Batteries," ACS Appl. Mater. Interfaces. 4(1):49-52.

Kumar et al. (2010) "A Solid-State, Rechargeable, Long Cycle Life Lithium-Air Battery," Journal of The Electrochemical Society. 157(1):A50-A54.

Lee et al. (Aug. 18, 2014) "A review of recent developments in membrane separators for rechargeable lithium-ion batteries," Energy and Environmental Science. 7:3857-3886.

Li et al. (Jan. 2012) "A Dual-Electrolyte Rechargeable Li-Air Battery with Phosphate Buffer Catholyte," Electrochemistry Communications. 14(1):78-81.

Li et al. (May 16, 2013) "The pursuit of rechargeable solid-state Li-air batteries," Energy and Environmental Science. 6:2302-2311.

Long et al. (2004) "Three-Dimensional Battery Architectures," Chem. Rev. 104:4463-4492.

Lu et al. (2011) "Aqueous Cathode for Next-Generation Alkali-Ion Batteries," J. Am. Chem. Soc. 133(15):5756-5759.

Lu et al. (2011) "Rechargeable-Ion Cathode-Flow Battery," J. Mater. Chem. 21:10113-10117.

Peng et al. (Aug. 3, 2012) "A Reversible and Higher-Rate Li—O2 Battery," Science. 337(6094):563-566.

Pu et al. (2006) "Preparation of PVDF—HFP microporous membrane for Li-ion batteries by phase inversion," Journal of Membrane Science. 272(1-2):11-14.

Raja et al. (Dec. 1, 2014) "Thin, flexible and thermally stable ceramic membranes as separator for lithium-ion batteries," J. Membrane Sci. 471:103-109.

Roberts et al. (2011) "3D Lithium Ion Batteries—From Fundamentals to Fabrication," J. Mater. Chem. 21:9876-9890.

Roumi (2010) "Shape changing transformations: Interactions with plasticity and electrochemical processes," Dissertation (Ph.D.), California Institute of Technology.

Scrosati (2007) "Nanomaterials: Paper powers battery breakthrough," Nature Nanotechnology. 2:598-599.

Seel et al. (2000) "Electrochemical Intercalation of PF6 into Graphite." Electrochem. Soc. 147(3):892-898.

Shao et al. (Apr. 6, 2012) "Electrocatalysts for Nonaqueous Lithium-Air Batteries: Status, Challenges, and Perspective," ACS Catal. 2(5):844-857.

(56) References Cited

OTHER PUBLICATIONS

Shi et al. (Aug. 6, 2014) "Single ion solid-state composite electrolytes with high electrochemical stability based on a poly(perfluoroalkylsulfonyl)-imide ionene polymer," J. Mater. Chem. A. 2:15952-15957.
Sun et al. (Feb. 2012) "Graphene Nanosheets as Cathode Catalysts for Lithium-Air Batteries with an Enhanced Electrochemical Performance," Carbon. 50(2):727-733.
Tan et al. (Jul. 1, 2012) "Synthesis and Characterization of Biphenyl-Based Lithium Solvated Electron Solutions," J. Phys. Chem. B 116(30):9056-9060.
Tarascon et al. (2001) "Issues and challenges facing rechargeable lithium batteries," Nature. 414:359-367.
Tu et al. (Feb. 11, 2015) "A Dendrite-Free Lithium Metal Battery Model Based on Nanoporous Polymer/Ceramic Composite Electrolytes and High Energy Electrodes," Small.
Weber et al. (2011) "Redox Flow Batteries: A Review," J. Appl. Electrochem. 41:1137-1164.
Wiesler (1996) "Membranes," Ultrapure Water. Article No. UP130427. Accessible on the Internet at URL: http://www.liquicel.com/uploads/documents/Membrane%20Contactors%20-%20An%20Introduction%20To%20The%20Technology.pdf. pp. 27-31.
Xu (2004) "Nonaqueous Electrolytes for Lithium-Based Rechargeable Batteries," Chemical Reviews. 104:4303-4417.
Zadin (May 08, 2012) "Modeling the 3-D Microbattery," University of Tartu. Accssible on the Internet at URL: http://dspace.utlib.ee/dspace/handle/10062/25375. [Last Accessed Jun. 26, 2013].
Zhang (2007) "A review on the separators of liquid electrolyte Li-ion batteries," Journal of Power Sources. 164(1):351-364.
Zheng et al. (Feb. 8, 2013) "Amphiphilic Surface Modification of Hollow Carbon Nanofibers for Improved Cycle Life of Lithium Sulfur Batteries," Nano Lett. 13(3):1265-1270.
Zhong et al. (Published online Dec. 5, 2011) "High-Capacity Silicon-Air Battery in Alkaline Solution," ChemSusChem. 5:177-180.
International Search Report with Written Opinion corresponding to International Patent Application No. PCT/US2011/051041, dated Apr. 30, 2012.
International Search Report with Written Opinion corresponding to International Patent Application No. PCT/US2012/046067, dated Jan. 30, 2013.
International Search Report with Written Opinion corresponding to International Patent Application No. PCT/US2013/021043, dated Jun. 27, 2013.
International Search Report with Written Opinion corresponding to International Patent Application No. PCT/US2014/066113, dated Feb. 19, 2015.
International Search Report with Written Opinion corresponding to International Patent Application No. PCT/US2014/066200, dated Feb. 12, 2015.
International Search Report with Written Opinion corresponding to International Patent Application No. PCT/US2015/024787, dated Jul. 16, 2015.
Notice of Allowance corresponding to Chinese Patent Application No. 201180042861.0, dated Oct. 27, 2015—with English translation.
Notice of Allowance corresponding to Chinese Patent Application No. 201280033561.0, dated Aug. 30, 2016—with English translation.
Notice of Allowance corresponding to U.S. Appl. No. 13/229,479, dated Jul. 7, 2017.
Notice of Allowance corresponding to U.S. Appl. No. 13/738,835, dated Mar. 2, 2016.
Notice of Allowance corresponding to U.S. Appl. No. 15/148,278, dated Jul. 29, 2017.
Office Action corresponding to Chinese Patent Application No. 201180042861.0, dated Apr. 10, 2015—with partial English translation.
Office Action corresponding to Chinese Patent Application No. 201180042861.0, dated Sep. 4, 2014—with English translation.
Office Action corresponding to Chinese Patent Application No. 201280033561.0, dated Jan. 4, 2016—with English summary.
Office Action corresponding to Chinese Patent Application No. 201280033561.0, dated Jun. 8, 2015—with English translation.
Office Action corresponding to Chinese Patent Application No. 201380030525.3, dated Apr. 1, 2016—with English summary.
Office Action corresponding to Chinese Patent Application No. 201380030525.3, dated Feb. 16, 2017—with English summary.
Office Action corresponding to Chinese Patent Application No. 201380030525.3, dated Nov. 16, 2017—with English summary.
Office Action corresponding to European Patent Application No. 12811935.1, dated Dec. 1, 2015.
Office Action corresponding to European Patent Application No. 12811935.1, dated Mar. 28, 2017.
Office Action corresponding to Japanese Patent Application No. 2013-528339, dated Aug. 18, 2015—with English translation.
Office Action corresponding to Japanese Patent Application No. 2013-528339, dated Jul. 5, 2016—with English translation.
Office Action corresponding to Japanese Patent Application No. 2014-520250, dated Aug. 1, 2017—with English translation.
Office Action corresponding to Japanese Patent Application No. 2014-520250, dated Aug. 16, 2016—with English translation.
Office Action corresponding to Japanese Patent Application No. 2015-505702, dated Jan. 10, 2017—with English translation.
Office Action corresponding to Japanese Patent Application No. 2015-505702, dated Sep. 5, 2017—with English translation.
Office Action corresponding to Korean Patent Application No. 10-2013-7007963, dated Sep. 22, 2017—with English translation.
Office Action corresponding to U.S. Appl. No. 13/229,479, dated Aug. 13, 2015.
Office Action corresponding to U.S. Appl. No. 13/229,479, dated May 19, 2016.
Office Action corresponding to U.S. Appl. No. 13/545,683, dated Dec. 1, 2016.
Office Action corresponding to U.S. Appl. No. 13/545,683, dated Nov. 23, 2015.
Office Action corresponding to U.S. Appl. No. 13/545,683, dated Oct. 5, 2017.
Office Action corresponding to U.S. Appl. No. 13/724,479, dated Jul. 27, 2017.
Office Action corresponding to U.S. Appl. No. 13/724,479, dated Oct. 7, 2016.
Office Action corresponding to U.S. Appl. No. 13/738,835, dated Aug. 3, 2015.
Office Action corresponding to U.S. Appl. No. 14/546,953, dated Oct. 12, 2017.
Office Action corresponding to U.S. Appl. No. 14/680,997, dated Apr. 21, 2017.
Office Action corresponding to U.S. Appl. No. 15/148,278, dated Feb. 9, 2017.
Office Action corresponding to U.S. Appl. No. 15/148,278, dated Oct. 18, 2016.
Search Report corresponding to European Patent Application No. 12811935.1, dated Mar. 9, 2015.
Search Report corresponding to European Patent Application No. 13775922.1, dated Feb. 1, 2016.
Search Report corresponding to European Patent Application No. 13775922.1, dated Jun. 15, 2016.

* cited by examiner

SEPARATOR ENCLOSURES FOR ELECTRODES AND ELECTROCHEMICAL CELLS

CROSS-REFERENCE TO RELATED APPLICATIONS

This application claims the benefit of and priority to U.S. Provisional Application No. 61/905,678, filed Nov. 18, 2013; U.S. Provisional Application No. 61/938,794, filed Feb. 12, 2014; U.S. Provisional Application No. 61/985,204, filed Apr. 28, 2014; and U.S. Provisional Application No. 62/024,104, filed Jul. 14, 2014; all of which are hereby incorporated by reference in their entireties to the extent not inconsistent herewith.

BACKGROUND OF INVENTION

Over the last few decades revolutionary advances have been made in electrochemical storage and conversion devices expanding the capabilities of these systems in a variety of fields including portable electronic devices, air and space craft technologies, passenger vehicles and biomedical instrumentation. Current state of the art electrochemical storage and conversion devices have designs and performance attributes that are specifically engineered to provide compatibility with a diverse range of application requirements and operating environments. For example, advanced electrochemical storage systems have been developed spanning the range from high energy density batteries exhibiting very low self-discharge rates and high discharge reliability for implanted medical devices to inexpensive, light weight rechargeable batteries providing long runtimes for a wide range of portable electronic devices to high capacity batteries for military and aerospace applications capable of providing extremely high discharge rates over short time periods.

Despite the development and widespread adoption of this diverse suite of advanced electrochemical storage and conversion systems, significant pressure continues to stimulate research to expand the functionality of these systems, thereby enabling an even wider range of device applications. Large growth in the demand for high power portable electronic products, for example, has created enormous interest in developing safe, light weight primary and secondary batteries providing higher energy densities. In addition, the demand for miniaturization in the field of consumer electronics and instrumentation continues to stimulate research into novel design and material strategies for reducing the sizes, masses and form factors of high performance batteries. Further, continued development in the fields of electric vehicles and aerospace engineering has also created a need for mechanically robust, high reliability, high energy density and high power density batteries capable of good device performance in a useful range of operating environments.

Many recent advances in electrochemical storage and conversion technology are directly attributable to discovery and integration of new materials for battery components. Lithium battery technology, for example, continues to rapidly develop, at least in part, due to the discovery of novel electrode and electrolyte materials for these systems. The element lithium has a unique combination of properties that make it attractive for use in an electrochemical cell. First, it is the lightest metal in the periodic table having an atomic mass of 6.94 AMU. Second, lithium has a very low electrochemical oxidation/reduction potential (i.e., −3.045 V vs. NHE (normal hydrogen reference electrode)). This unique combination of properties enables lithium based electrochemical cells to have very high specific capacities. State of the art lithium ion secondary batteries provide excellent charge-discharge characteristics, and thus, have also been widely adopted as power sources in portable electronic devices, such as cellular telephones and portable computers. U.S. Pat. Nos. 6,852,446, 6,306,540, 6,489,055, and "Lithium Batteries Science and Technology" edited by Gholam-Abbas Nazri and Gianfranceo Pistoia, Kluer Academic Publishers, 2004, which are hereby incorporated by reference in their entireties, are directed to lithium and lithium ion battery systems.

Advances in electrode materials, electrolyte compositions and device geometries continue to support the further development of Li based electrochemical systems. For example, U.S. Patent Application Publication US2012/0077095, published on Mar. 29, 2012, and International Patent Application publication WO 2012/034042, published on Mar. 15, 2012, disclose three-dimensional electrode array structures for electrochemical systems including lithium batteries.

Despite substantial advances, practical challenges remain in connection with the continued development of metal based electrochemical systems such as lithium, zinc, magnesium, sodium, iron or aluminum based electrochemical systems. A significant issue, for example, relates to dendrite formation in primary and secondary lithium and lithium ion batteries. It is generally known that Li deposition in many electrolytes is highly dendritic which make these systems susceptible to problems involving shorting, mechanical failure and thermal runaway. Safety concerns relating to dendrite formation are currently a barrier to implementation of metal Li anodes in rechargeable systems. A number of strategies have been pursued to address safety in connection with dendrite formation, particularly in the context of secondary batteries, including development of non-lithium anodes and internal safety systems able to monitor in real time problems associated with dendrite formation.

As will be generally recognized from the foregoing, a need currently exists for electrochemical systems, such as lithium based or alkaline based batteries, flow batteries, supercapacitors and fuel cells, exhibiting electrochemical properties useful for a range of applications. Specifically, lithium, zinc, magnesium, sodium, iron or aluminum based zinc based electrochemical systems capable of good electrochemical performance and high versatility for both primary and secondary lithium based batteries are needed.

SUMMARY OF THE INVENTION

In one aspect, the disclosure provides electrochemical cells including a separator enclosure which encloses at least a portion of a positive or negative electrode. In an embodiment, the separator generates a contact force or pressure on the entire free surface, or a portion thereof, of the electrode which can improve the performance of the cell. Advantages provided by some embodiments of the invention are achieved by the internal application of a contact force or pressure on one or more electrodes, as opposed to an external application of a contact force or pressure.

The applied pressure can improve the cycle life, e.g., by maintaining sufficient contact between the cell components. For example, the applied pressure is very helpful in cycling metal based electrodes such as lithium metal, zinc metal, ZnO or silicon anode. The applied pressure is also helpful to prevent material loss of the electrode and can help with the uniformity of the electrode, for example, by providing a substantially uniform thickness along the length of the electrode (e.g., deviations from an average thickness less than or equal to 20% and optionally less than or equal to 10% and optionally less than or equal to 5%). One example is in batteries such as lead acid batteries, lithium batteries or alkaline batteries (e.g. Zinc batteries), where the applied pressure can hinder the shape change of the electrode and thus improve the performance and cycle life. The applied pressure by the separator bag can also result in uniform and smooth electrode surfaces during cycling. Another benefit of the separator bag invention is the reduction in the required binder in the electrode, which itself results in higher percentage of active materials and thus higher energy and power density at a lower cost. Note that in electrode designs wherein the dominant contact between electrode media and current collector is through a facial area (e.g. a flat foil); a common performance decay mechanism is delamination which results in at least partial increase in electronic resistivity. Some embodiments of the invention incorporate a separator enclosure comprising a separator bag or container to mitigate this and related effects.

In another aspect, the disclosure provides methods for charging or cycling an electrochemical cell.

In an aspect, the disclosure provides electrochemical cells comprising a positive electrode, a negative electrode, one or more electrolytes positioned between the positive electrode and the negative electrode; wherein the one or more electrolytes are capable of conducting charge carriers and an electronically insulating and ionically conducting separator enclosure enclosing the entire free surface, or a portion thereof, of the positive electrode or the negative electrode. In an embodiment, the separator enclosure generates a contact force on the entire free surface, or portion thereof, of the positive electrode or the negative electrode; wherein the contact force is sufficient to prevent a substantial change in the porosity or surface roughness of the positive electrode or the negative electrode enclosed by the separator enclosure during cycling of the electrochemical cell. In an embodiment, the separator enclosure generates a contact force on the entire free surface, or a portion thereof, of the positive electrode or the negative electrode; wherein the contact force is sufficient to prevent a substantial change in one or more physical dimensions or shape of the positive electrode or the negative electrode enclosed by the separator enclosure during cycling of the electrochemical cell, for example, a change in a physical dimensions (e.g., thickness) equal to or greater than 10% of the average value of the physical dimension. In an embodiment, the separator enclosure is in the form of a bag or container.

In some embodiments, the separator enclosure encloses, and optionally provides the contact force on, the entire free surface of the positive or negative electrode. In some embodiments, the separator enclosure encloses, and optionally provides the contact force on, only a portion of the free surface of the positive or negative electrode, for example 80% or less of the free surface; and in some embodiments, 50% or less of the free surface; and in some embodiments, 30% or less of the free surface.

In some embodiments, the separator enclosure encloses, and optionally provides the contact force on, substantially all of the external surface of the positive or negative electrode, for example 80% or more of the external surface and in some embodiments, 90% or more of the external surface. In some embodiments, the separator enclosure entirely encloses the external surface of the positive or negative electrode.

In an embodiment, as the size and shape of the electrode changes during charging and discharging of the cell, the size and shape of the separator enclosure changes and thus a pressure is generated between the separator enclosure and the electrode. The pressure generated is a function of the size-shape change which is itself a function of the State of the Charge of the battery.

In an embodiment the enclosed electrode comprises an active material and separator enclosure encloses the external surface, exposed surface or free surface of the active material. In an embodiment, the separator encloses the surface of the active material which is not in contact with the current collector but need not enclose the whole of the current collector. In an embodiment, the free surface of an electrode is the surface of the electrode not covered by, or otherwise in physical contact with, a current collector.

In an embodiment, the contact force is sufficient to increase the cycle life of the electrochemical cell. In an embodiment, the cycle life increases by a factor of 2.

In an embodiment, the contact force is sufficient to prevent a substantial loss, e.g., equal or greater than 20% of active mass after each 500 full cycles or more, of active material of said positive electrode or said negative electrode enclosed by said separator enclosure during cycling of said electrochemical cell. In an embodiment, the contact force is sufficient to limit the increase in surface roughness to less than or equal to 200%, after 500 full cycles. In an embodiment, the contact force is sufficient to provide for a change in surface roughness per cycle less than 0.2%, as averaged over 10 cycles. In an embodiment, the contact force is sufficient to limit the change in electrode porosity to less than or equal to 20% after each 500 full cycles or more. In an embodiment, the contact force is sufficient to limit the change in electrode porosity per cycle to less than 0.1%, as averaged over 10 cycles.

In a further embodiment, the separator enclosure generates a contact force or pressure sufficient to prevent a substantial change in electrode porosity, electrode surface roughness, one or more physical dimensions or shape of the electrode enclosed by the separator enclosure, for example, after each cycle of the electrochemical cell. In an embodiment, a substantial change in porosity, one or more physical dimensions of an electrode occurs when the change in electrode porosity or surface roughness is greater than 0.1%, between two successive full cycles, averaged over 10 cycles. Therefore, by applying enough pressure on the electrode surface by the separator, substantial changes in the electrode porosity or surface roughness can be prevented, for example, when the pressure keeps the change in the physical dimension or the volume uniform.

In an embodiment, the uniformity of the electrode surface is maintained by applying pressure on the electrode surface by the separator. By applying enough pressure on the electrode surface, substantial changes in the electrode porosity or surface roughness can be prevented. In embodiments, the change in electrode porosity per 20 cycles is less than 2%, 1%, or 0.5% as averaged over 10 cycles. In embodiments, the change in surface roughness per 10 cycles is less than 2%, 1%, or 0.5% as averaged over 10 cycles. The separator enclosures of the disclosure are particularly useful for conversion type anodes or cathodes such as lithium or silicon anodes or iron- and fluoride-containing cathode materials in lithium ion based batteries and such as zinc anodes in zinc based batteries (e.g. Zn—Ni and Zn-air batteries).

In a further embodiment, the separator enclosure generates a contact force or pressure sufficient to prevent a substantial loss of active material of the electrode enclosed by the separator enclosure during cycling of the electrochemical cell. In an embodiment, a substantial loss in active material occurs when amount of active material lost is greater than 20 wt %. Therefore a substantial loss of active material can be prevented when the loss of active material is less than or equal to 20 wt %. In other embodiments, the separator enclosure generates a contact force or pressure sufficient to reduce the loss of active material to less than or equal to 10 wt %.

In an additional embodiment, the separator enclosure generates a contact force or pressure sufficient to maintain a smooth external surface of the electrode enclosed by the separator enclosure during cycling of the electrochemical cell. The required force level may change in different cell formats and chemistries.

In an embodiment, a uniform and smooth external surface is maintained when the surface roughness change, between two successive charge discharge cycles, is less than or equal to 0.1%, averaged over 10 cycles. In another embodiment, a uniform and smooth external surface is maintained when the electrode porosity change, between two successive charge discharge cycles, is less than or equal to 0.1%, averaged over 10 cycles.

In an embodiment, the force provided on the electrode is internal to the electrochemical cell, as opposed to being an external force, for example, provide by an external component. Embodiments, providing an internal force are beneficial for providing a selected and substantially uniform contact force or pressure.

In an embodiment, the contact force is generated by an elastic force of the separator enclosure provided in an expanded state. In an embodiment, the separator enclosure expands due to change shape or volume caused by a shape or increase in volume of the enclosed electrode.

In an embodiment, the amount of the required pressure at any given time is a function of the State Of Charge of the cell and the State Of Health of the cell. In one embodiment the pressure is the highest at the end of the discharge (or beginning of the charge), is the lowest at the beginning of the discharge (or end of the charge) and varies linearly between these two values. The pressure may also depend on the geometry, shape and the initial porosity of the electrode.

In an embodiment, the contact force is characterized by an average contact pressure selected from the range of 10 Pa and 10 MPa or, optionally for some embodiments, selected from the range of 1 kPa and 100 kPa. In an embodiment, the contact force is provided on entire free surface, or a portion thereof, of the surface area of the positive electrode or the negative electrode enclosed by the separator enclosure. In an embodiment, the contact force is substantially uniform across the entire free surface, or portion thereof, of the surface area of the positive electrode or the negative electrode enclosed by the separator enclosure. In an embodiment, the contact force is substantially uniform when the deviation from an average value is less than or equal to 50%. In an embodiment, the contact force may decrease to almost zero at the end of charge of the electrochemical cell, charging of the electrochemical cell or both. In an embodiment the contact force changes systematically during discharge of the electrochemical cell or charging of the electrochemical cell or both by an amount selected from the range of 10 Pa and 10 MPa.

In an embodiment, the contact force is generated by an elastic force of the separator enclosure provided in an expanded state. In an embodiment, the separator enclosure expands due to change in shape or volume caused by a shape change or increase in volume of the enclosed electrode. In an embodiment, the expanded state is an increase in a volume contained by the separator enclosure as much as 1000%.

In embodiments, the separator enclosure encloses a portion of the negative or positive enclosure or entirely encloses the negative or positive electrode. In an embodiment, the negative electrode is enclosed; in another embodiment the positive electrode is enclosed. In an embodiment, the separator enclosure is in physical contact with an active material of the positive electrode or the negative electrode enclosed by the separator enclosure or is in physical contact with an intermediate structure provided between an active material of positive electrode or the negative electrode and the enclosure separator. In a further embodiment, a first separator enclosure encloses the negative electrode and a second separator enclosure encloses the positive electrode. In an embodiment, the additional separator enclosure generates a contact force on at least a portion of the surface area of the positive electrode; wherein the contact force is sufficient to prevent a substantial change in electronic performance of the positive electrode enclosed by the additional separator enclosure during cycling of the electrochemical cell.

In an embodiment, the enclosure separator has an electronic resistance high enough to prevent electronic contact between the positive electrode and the negative electrode. In an embodiment, the enclosure separator comprises a multilayer structure. In embodiments, the enclosure separator comprises one or more layers each layer independently having a thickness selected from the range of 20 nm to 10 mm, 20 nm to 1 mm or optionally for some applications 1 µm to 1 mm. In embodiments, the enclosure separator comprises one or more perforated or porous layers each independently having a porosity greater than or equal to 30%, from 30% to 80% or from 50% to 75%. In an embodiment the enclosure separator comprises a chemical barrier capable of preventing transport of one or more reaction products from the negative electrode or the positive electrode to the electrolyte. (For example, a LISICON or PEO barrier to prevent transport of polysulfides from a sulfur cathode in a lithium-sulfur battery).

In an embodiment, the enclosure separator comprises one or more high mechanical strength layers. In an embodiment, the high mechanical strength layer is selected from the group consisting of a polymer, a metal, an alloy, thin film and an oxide. In an embodiment, the high mechanical strength layer comprises one or more materials selected from the group consisting of silicone, polyethylene terephthalate (PET), polyethylene (PE), polypropylene (PP), polyether ether ketone (PEEK), polyvinylidene difluoride (PVDF), Polysulfone, polyimide (e.g. Kapton®), Polyester (e.g. Mylar®), polyurethane, polyvinyl chloride (PVC), aluminized Mylar, PEO, LIPON, LISICON, NASICON, Nafion and fiberglass.

In an embodiment, the enclosure separator comprises one or more low ionic resistance layers each independently having JIS Gurley number less than or equal to 5000 seconds, preferably for some applications less than 2000 seconds, and preferably for some applications less than 1000 seconds. In an embodiment, the low ionic resistance layer comprises a reservoir for the electrolyte. In an embodiment, the low ionic resistance layer comprises one or more materials selected from the group consisting of nonwoven polyolefins, polyethylene, polypropylene, polyesters, polyimides, nylon, PVDF, PTFE, PEO, LIPON, LISICON and combinations thereof. For example, nonwoven polyolefins include nonwoven materials with a polypropylene (PP) skin and a polyethylene (PE) core.

In an embodiment, the enclosure separator comprises a first high mechanical strength layer and a low ionic resistance layer. In an embodiment, the low ionic resistance layer is provided between the first high mechanical strength layer and an external surface of the positive electrode or negative electrode enclosed by the separator enclosure or provided on a side of the first high mechanical strength layer positioned opposite to the positive electrode or negative electrode enclosed by the separator enclosure. In an embodiment, the enclosure separator further comprises a second high mechanical strength layer wherein the low ionic resistance layer is provided between the first high mechanical strength layer and the second high mechanical strength layer. In an embodiment, the second high mechanical strength layer is provided in contact with the positive electrode or the negative electrode or an intermediate structure provided between the first high mechanical strength and the positive electrode or the negative electrode. In an embodiment the first and second high mechanical strength layers independently comprises one or more materials selected from the group consisting of a polymer, a metals, an alloys, thin film and an oxide. In an embodiment, the first and second high mechanical strength layers independently comprises one or more materials selected from the group consisting of silicone, PET, PE, PP, PEEK, PVDF, Polysulfone, Kapton, Polyester, Mylar, polyurethanes, PVC, and fiberglass.

In an embodiment the enclosure separator comprises one or more layers independently comprising an elastomer. Suitable elastomers, include, but are not limited to, silicone polymers, polydimethylsiloxane (PDMS), Natural polyisoprene: cis-1,4-polyisoprene natural rubber (NR) and trans-1,4-polyisoprene gutta-percha, Synthetic polyisoprene, Butyl rubber, Polybutadiene, Nitrile rubber, ethylene propylene rubber, Polyacrylic rubber, Fluoroelastomers, Polyether block amides, Ethylene-vinyl acetate, Polysulfide rubber, Elastolefin or combinations thereof. In an embodiment, the elastomer has an elongation to break of from 100% to 1000% or optionally for some applications 250% to 600%. In another embodiment, the enclosure separator further comprises a thermoplastic polymer; in an embodiment, the thermoplastic polymer has a compressive modulus of 0.01 to 4 GPa, 0.1 GPa to 1 GPa, or 1 GPa to 4 GPa (at room temperature).

In an embodiment, the enclosure separator comprises a first layer having a plurality of apertures arranged in a first pattern and a second layer having a plurality of apertures arranged in a second pattern; wherein the second pattern has an off-set alignment relative to the first pattern such that an overlap of the apertures of the first layer and the apertures of the second layer along axes extending perpendicularly from the first layer to the second layer is less than or equal to 20%. In an embodiment, the first pattern and the second patterns are periodic patterns. wherein the apertures of the first pattern and the second patterns are each independently characterized by at least one cross sectional dimension selected from the range of 10 µm to 1 mm. In an embodiment, the first pattern and the second pattern comprise substantially complementary patterns. In an embodiment, substantially complementary patterns correspond to substantially negative images of one another. In some embodiments, the enclosure separator enclosure comprises a series of layers as described in US Patent Publication 2013/0017432.

In an embodiment, the positive or negative electrode enclosed by the separator enclosure is a metal electrode. In an embodiment, the positive or negative electrode enclosed by the separator enclosure is a zinc electrode, lithium electrode, ZnO electrode, a silicon electrode, a germanium electrode, a carbonaceous electrode, a fluorinated electrode, an air-carbon electrode or a sulfur electrode. In an embodiment, the positive electrode or the negative electrode enclosed by the separator enclosure is an intercalation electrode. In an embodiment, the electrolyte comprises one or more lithium salts dissolved in a nonaqueous solvent.

In an embodiment, the electrolyte is a liquid electrolyte, gel electrolyte, polymer electrolyte or ceramic electrolyte. In an embodiment, the electrolyte is an aqueous or nonaqueous electrolyte.

In an embodiment, the electrochemical cell is a primary electrochemical cell or a secondary electrochemical cell. In an embodiment the electrochemical cell a primary battery, a secondary battery, a fuel cell or a flow battery, a lithium battery, a lithium ion battery, a zinc anode-based battery, a nickel cathode-based battery, or a lead-acid-based battery. In an embodiment the electrochemical cell is a Li—S, Li-Air, Li-ion, Li—LiFePO$_4$, or Zn—Ni electrochemical cell. In an embodiment the electrochemical cell is a semis-solid electrochemical cell or a flow battery.

In an aspect, at least the porosity of one of the layers of the separator enclosure of the electrochemical cell is filled with a solid filler, comprising a polymer electrolyte, for example PEO and LIPON in a li-ion based cell, or a ceramic or glass electrolyte, for example LISICON and NASICON, or an electrode protective layer, for example Li$_3$N, TiO$_2$ or LiNO$_3$ in a li-ion cell. The solid filler in combination with the separator bag can perform as a solid electrolyte.

In an embodiment, at least a portion of the porosity (e.g. the volume of pores, openings or channels) of at least one of the layers of the said separator enclosure of the said electrochemical cell is filled with a solid filler. In an embodiment, the solid filler comprises a polymer electrolyte, including but not limited to PEO and LIPON. In an embodiment, the solid filler comprises a ceramic or glass electrolyte, including but not limited to LISICON and NASICON. In an embodiment, the solid filler comprises an electrode protective layer, including but not limited to Li3N, TiO2 or LiNO3.

In an aspect, the invention provides a method for enhancing cycling performance of an electrochemical cell; said method comprising: (i) providing said electrochemical cell comprising (1) a positive electrode; (2) a negative electrode; (3) one or more electrolytes positioned between said positive electrode and said negative electrode; wherein said one or more electrolytes are capable of conducting charge carriers; and (4) an electrically insulating and ionically conductive separator enclosure enclosing the entire free surface, or portion thereof, of said positive electrode or said negative electrode; wherein said separator enclosure generates a contact force on at least a portion of the surface area of said positive electrode or said negative electrode; and (ii) establishing said contact force is sufficient to prevent a substantial change in electrode porosity or surface roughness of said positive electrode or said negative electrode enclosed by said separator enclosure during cycling of said electrochemical cell. In an embodiment, the electrically insulating and ionically conductive separator enclosure encloses the entire free surface of said positive electrode or said negative electrode.

In an aspect, the invention provides a method for generating an electrical current, the method comprising the steps of: (i) providing an electrochemical cell comprising: (1) a positive electrode; (2) a negative electrode; (3) one or more electrolytes positioned between said positive electrode and said negative electrode; wherein said one or more electrolytes are capable of conducting charge carriers; and (4) an electrically insulating and ionically conductive separator enclosure enclosing the entire free surface, or portion thereof, of said positive electrode or said negative electrode, wherein said separator enclosure generates a contact force on the entire free surface, or portion thereof, of said positive electrode or said negative electrode; wherein said contact force is sufficient to prevent a substantial change electrode porosity or surface roughness of said positive electrode or said negative electrode enclosed by said separator enclosure during cycling of said electrochemical cell; and (ii) discharging said electrochemical cell. In an embodiment, the electrically insulating and ionically conductive separator enclosure encloses the entire free surface of said positive electrode or said negative electrode.

In an aspect, the invention provides a method for (i) making an electrochemical cell, the method comprising the steps of: (1) providing a positive electrode; (2) providing a negative electrode; (3) providing one or more electrolytes positioned between said positive electrode and said negative electrode; wherein said one or more electrolytes are capable of conducting charge carriers; and (iii) at least partially enclosing said positive electrode or said negative electrode with an electrically insulating and ionically conductive separator enclosure enclosing the entire free surface, or portion thereof, of said positive electrode or said negative electrode, wherein said separator enclosure generates a contact force on the entire free surface, or portion thereof, of said positive electrode or said negative electrode; wherein said contact force is sufficient to prevent a substantial change in electrode porosity or surface roughness of said positive electrode or said negative electrode enclosed by said separator enclosure during cycling of said electrochemical cell. In an embodiment, the electrically insulating and ionically conductive separator enclosure encloses the entire free surface of said positive electrode or said negative electrode.

In an aspect, the invention provides a method for enhancing cycling performance of an electrochemical cell, the method comprising a) Providing an electrochemical cell comprising a positive electrode, a negative electrode, one or more electrolytes positioned between the positive electrode and the negative electrode; wherein the one or more electrolytes are capable of conducting charge carriers and an electronically insulating and ionically conducting separator enclosure enclosing the entire free surface, or portion thereof, of the positive electrode or the negative electrode; and b) Establishing a contact force sufficient to prevent a substantial change in electrode porosity or surface roughness of the positive electrode or the negative electrode enclosed by the separator enclosure during cycling of the electrochemical cell.

In another aspect, the disclosure provides a method for generating an electrical current the method comprising the steps of:

a) Providing an electrochemical cell comprising a positive electrode, a negative electrode, one or more electrolytes positioned between the positive electrode and the negative electrode; wherein the one or more electrolytes are capable of conducting charge carriers and an electronically insulating and ionically conducting separator enclosure enclosing the entire free surface, or portion thereof, of the positive electrode or the negative electrode; and b) Discharging the electrochemical cell.

In another aspect, the disclosure provides a method making an electrochemical cell, the method comprising the steps of:

a) providing a positive electrode;
b) providing a negative electrode;
c) providing one or more electrolytes positioned between the positive electrode and the negative electrode; wherein the one or more electrolytes are capable of conducting charge carriers; and
d) at least partially enclosing the positive electrode or the negative electrode with an electrically insulating and ionically conductive separator enclosure enclosing the entire free surface, or portion thereof, of the positive electrode or the negative electrode, wherein the separator enclosure generates a contact force the entire free surface, or portion thereof, of the positive electrode or the negative electrode; wherein the contact force is sufficient to prevent a substantial change in electrode porosity or surface roughness of the positive electrode or the negative electrode enclosed by the separator enclosure during cycling of the electrochemical cell.

DETAILED DESCRIPTION OF THE INVENTION

Figure 1:
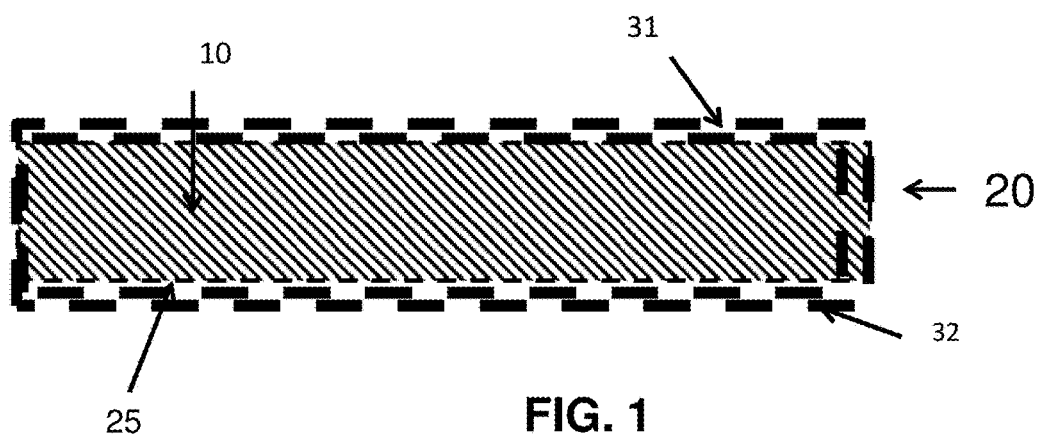
FIG. 1. Separator enclosure for an electrode comprising first perforated mechanically strong layer and second perforated mechanically strong layer.

In general the terms and phrases used herein have their art-recognized meaning, which can be found by reference to standard texts, journal references and contexts known to those skilled in the art. The following definitions are provided to clarify their specific use in the context of the invention.

Referring to the drawings, like numerals indicate like elements and the same number appearing in more than one drawing refers to the same element. In addition, hereinafter, the following definitions apply:

The term "electrochemical cell" refers to devices and/or device components that convert chemical energy into electrical energy or electrical energy into chemical energy. Electrochemical cells have two or more electrodes (e.g., positive and negative electrodes) and an electrolyte, wherein electrode reactions occurring at the electrode surfaces result in charge transfer processes. Electrochemical cells include, but are not limited to, primary batteries, secondary batteries and electrolysis systems. In certain embodiments, the term electrochemical cell includes fuel cells, supercapacitors, capacitors, flow batteries, metal-air batteries and semi-solid batteries. General cell and/or battery construction is known in the art, see e.g., U.S. Pat. Nos. 6,489,055, 4,052,539, 6,306,540, Seel and Dahn J. Electrochem. Soc. 147(3) 892-898 (2000).

The term "capacity" is a characteristic of an electrochemical cell that refers to the total amount of electrical charge an electrochemical cell, such as a battery, is able to hold. Capacity is typically expressed in units of ampere-hours. The term "specific capacity" refers to the capacity output of an electrochemical cell, such as a battery, per unit weight. Specific capacity is typically expressed in units of ampere-hours $kg^{-1}$.

The term "discharge rate" refers to the current at which an electrochemical cell is discharged. Discharge rate can be expressed in units of ampere. Alternatively, discharge rate can be normalized to the rated capacity of the electrochemical cell, and expressed as C/(X t), wherein C is the capacity of the electrochemical cell, X is a variable and t is a specified unit of time, as used herein, equal to 1 hour.

"Current density" refers to the current flowing per unit electrode area.

Electrode refers to an electrical conductor where ions and electrons are exchanged with electrolyte and an outer circuit. "Positive electrode" and "cathode" are used synonymously in the present description and refer to the electrode having the higher electrode potential in an electrochemical cell (i.e. higher than the negative electrode). "Negative electrode" and "anode" are used synonymously in the present description and refer to the electrode having the lower electrode potential in an electrochemical cell (i.e. lower than the positive electrode). Cathodic reduction refers to a gain of electron(s) of a chemical species, and anodic oxidation refers to the loss of electron(s) of a chemical species. Positive electrodes and negative electrodes of the present electrochemical cell may further comprise a conductive diluent, such as acetylene black, carbon black, powdered graphite, coke, carbon fiber, graphene, and metallic powder, and/or may further comprises a binder, such as a polymer binder. Useful binders for positive electrodes in some embodiments comprise a fluoropolymer such as polyvinylidene fluoride (PVDF). Positive and negative electrodes of the present invention may be provided in a range of useful configurations and form factors as known in the art of electrochemistry and battery science, including thin electrode designs, such as thin film electrode configurations. Electrodes are manufactured as disclosed herein and as known in the art, including as disclosed in, for example, U.S. Pat. Nos. 4,052,539, 6,306,540, and 6,852,446. For some embodiments, the electrode is typically fabricated by depositing a slurry of the electrode material, an electronically conductive inert material, the binder, and a liquid carrier on the electrode current collector, and then evaporating the carrier to leave a coherent mass in electrical contact with the current collector.

"Electrode potential" refers to a voltage, usually measured against a reference electrode, due to the presence within or in contact with the electrode of chemical species at different oxidation (valence) states.

"Electrolyte" refers to an ionic conductor which can be in the solid state, the liquid state (most common) or more rarely a gas (e.g., plasma).

"Standard electrode potential" (E°) refers to the electrode potential when concentrations of solutes are 1 M, the gas pressures are 1 atm and the temperature is 25 degrees Celsius. As used herein standard electrode potentials are measured relative to a standard hydrogen electrode.

"Active material" refers to the material in an electrode that takes part in electrochemical reactions which store and/or deliver energy in an electrochemical cell.

"Cation" refers to a positively charged ion, and "anion" refers to a negatively charged ion.

"Electrical contact," "electrical communication", "electronic contact" and "electronic communication" refer to the arrangement of one or more objects such that an electric current efficiently flows from one object to another. For example, in some embodiments, two objects having an electrical resistance between them less than 100 Ω are considered in electrical communication with one another. An electrical contact can also refer to a component of a device or object used for establishing electrical communication with external devices or circuits, for example an electrical interconnection. "Electrical communication" also refers to the ability of two or more materials and/or structures that are capable of transferring charge between them, such as in the form of the transfer of electrons. In some embodiments, components in electrical communication are in direct electrical communication wherein an electronic signal or charge carrier is directly transferred from one component to another. In some embodiments, components in electrical communication are in indirect electrical communication wherein an electronic signal or charge carrier is indirectly transferred from one component to another via one or more intermediate structures, such as circuit elements, separating the components.

"Thermal contact" and "thermal communication" are used synonymously and refer to an orientation or position of elements or materials, such as a current collector or heat transfer rod and a heat sink or a heat source, such that there is more efficient transfer of heat between the two elements than if they were thermally isolated or thermally insulated. Elements or materials may be considered in thermal communication or contact if heat is transported between them more quickly than if they were thermally isolated or thermally insulated. Two elements in thermal communication or contact may reach thermal equilibrium or thermal steady state and in some embodiments may be considered to be constantly at thermal equilibrium or thermal steady state with one another. In some embodiments, elements in thermal communication with one another are separated from each other by a thermally conductive material or intermediate thermally conductive material or device component. In some embodiments, elements in thermal communication with one another are separated by a distance of 1 μm or less. In some embodiments, elements in thermal communication with one another are provided in physical contact.

"High mechanical strength" or "mechanically strong" refers to a property of components of separator systems of the invention having a mechanical strength sufficient to for an intended purpose. In an embodiment, the separator component has sufficient mechanical strength to apply pressure to the surface of an electrode. In further embodiments, the separator component has sufficient mechanical strength to prevent physical contact of opposite electrodes, sufficient to prevent short circuiting due to external objects within the cell, such as metallic particles from fabrication, and sufficient to prevent short circuiting due to growth of dendrites between positive and negative electrodes of an electrochemical cell, for example, during charge and discharge cycles of a secondary electrochemical cell. In an embodiment, for example, a high mechanical strength layer has a mechanical strength sufficient to prevent piercing due to external objects in the cell, such as metallic particles from the fabrication, and shorts due to the growth of dendrites between electrodes. In an embodiment, for example, a high mechanical strength layer has a mechanical strength sufficient to prevent shorting between the positive electrode and the negative electrode of an electrochemical cell due to external objects in the cell such as metallic particles from the fabrication and shorts due to the growth of dendrites between electrodes. In an embodiment, for example, a high mechanical strength layer is characterized by a Young's modulus greater than or equal to 500 MPa, and optionally for some applications a Young's modulus greater than or equal to 1 GPa, and optionally for some applications a Young's modulus greater than or equal to 10 GPa, and optionally for some applications a Young's modulus greater than or equal to 100 GPa. In an embodiment, for example, a high mechanical strength layer is characterized by a yield strength greater than or equal to 5 MPa, and optionally for some applications a yield strength greater than or equal to 50 MPa, and optionally for some applications a yield strength greater than or equal to 100 MPa, and optionally for some applications a yield strength greater than or equal to 500 MPa. In an embodiment, for example, a high mechanical strength layer is characterized by a propagating tear strength greater than or equal to 0.005 N, and optionally for some applications a propagating tear strength greater than or equal to 0.05 N, a propagating tear strength greater than or equal to 0.5 N, a propagating tear strength greater than or equal to 1 N. In an embodiment, for example, a high mechanical strength layer is characterized by an initiating tear strength greater than or equal to 10 N, and optionally for some applications an initiating tear strength greater than or equal to 100 N. In an embodiment, for example, a high mechanical strength layer is characterized by a tensile strength greater than or equal to 50 MPa, and optionally for some applications a tensile strength greater than or equal to 100 MPa, and optionally for some applications a tensile strength greater than or equal to 500 MPa, and optionally for some applications a tensile strength greater than or equal to 1 GPa. In an embodiment, for example, a high mechanical strength layer is characterized by an impact strength greater than or equal to 10 N cm, and optionally for some applications to an impact strength greater than or equal to 50 N cm, and optionally for some applications to an impact strength greater than or equal to 100 N cm, and optionally for some applications to an impact strength greater than or equal to 500 N cm.

"Ionic resistance" refers to the resistance of a material to the transport of ionic charge carriers. In an embodiment, for example, each of the one or more low ionic resistance layers independently has an ionic resistance less than or equal to 20 ohm-cm$^2$, and preferably for some embodiments less than or equal to 2 ohm-cm$^2$ and preferably for some embodiments less than or equal to 1 ohm-cm$^2$.

"Chemically resistant" refers a property of components, such as layers, of separators and electrochemical systems of the invention wherein there is no significant chemical or electrochemical reactions with the cell active materials, such as electrodes and electrolytes. In certain embodiments, chemically resistant also refers to a property wherein the tensile retention and elongation retention is at least 90% in the working environment of an electrochemical system, such as an electrochemical cell.

"Thermally stable" refers a property of components, such as layers, of separators and electrochemical systems of the invention wherein there is no significant chemical or electrochemical reactions due to normal and operational thermal behavior of the cell. In certain embodiments, thermally stable also refers to materials wherein the melting point is more than 100 Celsius, and preferably for some embodiments more than 300 Celsius, and optionally the coefficient of thermal expansion is less than 50 ppm/Celsius. In an embodiment, thermally stable refers to a property of a component of the separator system such that it may perform in a rechargeable electrochemical cell without undergoing a change size or shape with the temperature that significantly degrades the performance of the electrochemical cell.

"Porosity" refers to the amount of a material or component, such as a high mechanical strength layer, that corresponds to pores, such as apertures, channels, voids, etc. Porosity may be expressed as the percentage of the volume of a material, structure or device component, such as a high mechanical strength layer, that corresponds to pores, such as apertures, channels, voids, etc., relative to the total volume occupied by the material, structure or device component.

"Elastomer" refers to a polymeric material which can be stretched or deformed and returned to its original shape without substantial permanent deformation. Elastomers commonly undergo substantially elastic deformations. Useful elastomers include those comprising polymers, copolymers, composite materials or mixtures of polymers and copolymers. Elastomeric layer refers to a layer comprising at least one elastomer. Elastomeric layers may also include dopants and other non-elastomeric materials. Useful elastomers include, but are not limited to, thermoplastic elastomers, styrenic materials, olefinic materials, polyolefin, polyurethane thermoplastic elastomers, polyamides, synthetic rubbers, PDMS, polybutadiene, polyisobutylene, poly(styrene-butadiene-styrene), polyurethanes, polychloroprene and silicones. In some embodiments, an elastomeric stamp comprises an elastomer. Exemplary elastomers include, but are not limited to silicon containing polymers such as polysiloxanes including poly(dimethyl siloxane) (i.e. PDMS and h-PDMS), poly(methyl siloxane), partially alkylated poly(methyl siloxane), poly(alkyl methyl siloxane) and poly (phenyl methyl siloxane), silicon modified elastomers, thermoplastic elastomers, styrenic materials, olefinic materials, polyolefin, polyurethane thermoplastic elastomers, polyamides, synthetic rubbers, polyisobutylene, poly(styrene-butadiene-styrene), polyurethanes, polychloroprene and silicones.

A polyolefin refers to any of a class of synthetic resins prepared by polymerization of olefins. Olefins include, but are not limited to, ethylene and propylene.

Electrochemical Cell.

In an embodiment, the electrochemical cell is a secondary (rechargeable) electrochemical cell. In another embodiment, the electrochemical cell is a primary electrochemical cell. In embodiments, the electrochemical cell is a primary battery, a secondary battery, a fuel cell or a flow battery, a semi-solid battery, a lithium battery, a lithium ion battery, a zinc anode-based battery, a nickel cathode-based battery, or a lead-acid-based battery. In additional embodiments, the electrochemical cell is a Li—S, Li-Air, Li—LiFePO$_4$, or Zn—Ni electrochemical cell. In an embodiment, the electrochemical cell is a lithium metal battery, a lithium ion battery or a zinc metal battery, another type of alkaline battery or a lead acid battery.

Electronically Insulating Separator Enclosure

In an embodiment, the electrochemical cell comprises an electronically insulating separator enclosure which at least partially encloses one of the negative electrode or the positive electrode. In an embodiment, the separator enclosure covers the entirety of the surface of the negative or positive electrode which faces the other or opposite electrode. In an embodiment, the separator has a closed geometry so that it encloses all the surfaces of the electrode. An example is such that the separator covers at least the entire surface of an electrode facing the opposite electrode. In some embodiments the separator can have a closed geometry such that it can cover all the surfaces of an electrode.

The amount of pressure from the separator on the electrode can vary during the charge and discharge, depending on the chemistry of reactions and materials, structure, applied current-voltage and other factors, and thus careful design to consider the changes is recommended. As an example, for lithium metal electrodes, enough pressure should be kept during plating lithium on the electrode to insure proper electroplating needed for improved performance and cycle life.

As an example in an electrochemical cell the separator comprises a separator-bag for the anode and the separator itself consists of more than one layer. In some experiments, any of the electrodes can have a separator-bag as described, for example in a lithium-sulfur battery, a silicon based anode lithium-ion battery or air battery.

In embodiments, the electronically insulating separator enclosure exerts a contact force or pressure on at least one surface of an electrode. If the separator is a closed geometry that contains the electrode the applied pressure can be due to the elastic or super-elastic behavior of the separator. If the separator only covers part of the electrode then the applied pressure can be the result of the pressure of the separator on one side of the electrode and the pressure from the current collector or other cell components from the other side of the electrode, and can be due to the fixed volume of the cell.

In an embodiment, the applied contact force or pressure hinders shape change of the electrode during cycling and thus improves cell performance and cycle life.

The separator bag dimensions depend on the electrode size, preferably the separator inner surface area should be the same as the electrode surface area or slightly larger; the separator bag thickness can be the same as conventional separators, for example about 0.025 mm for lithium batteries, about 0.1 mm for alkaline batteries and about 1 mm for lead-acid batteries.

The materials used to make the separator bags can depend on the electrode material, electrolyte and the performing conditions (such as cycle rate and environmental conditions such as temperature or pressure). One example is that the separator-bags if used with sulfur cathode can prolong the cell cycle life and improve the performance by hindering the material escape (here polysulphides) from the sulfur cathode, while accommodating the shape change during cycling. It is believed that separators such as Celgard® cannot apply the same level of pressure as the separator enclosures described herein. However, the separator bag in some embodiments comprises conventional separator materials (such as micro-porous PE, PP, polyester or polyimide materials) or solid or polymer electrolytes (e.g., LISICON, PEO, PAN, LIPON).

In an embodiment, the separator enclosure comprises a plurality of electronically insulating layers. The separator itself can be made of at least two layers with different properties or structure. As an example the separator can be made of at least one mechanically strong layer for the support and at least one highly porous and low resistance layer for providing good conductivity. For example the separator-bag can be made of a strong porous or perforated layer (such as polyester films with 40% holes, hole sizes can also be from nanometers to millimeters) covering the entire anode surface and a low resistant layer (such as nonwoven polyolefins) on the outer side away from the anode, facing the rest of the cell and the cathode. In another example two identical mechanically strong layers are used; each mechanically strong layer having a periodic pattern of apertures.

The mechanically strong layer assists in the application of contact force or pressure to the surface of the electrode. In embodiment the strong layer can be made of polymers, metals, alloys, ceramics, silicone, PET, PE, PP, PEEK, PVDF, Polysulfone, Kapton®, Polyester, Mylar®, polyurethanes, PVC, fiberglass, high melting temperature and mechanically robust layers or any of their combinations. In an embodiment, the porous layer is made of nonwoven polyolefins. In an embodiment, the layer is a perforated sheet of silicone, PET, PE, PP, PEEK, Polysulfone, Kapton®, Polyester, Mylar® or Hirose 06HOP-2 nonwoven. The size of the holes in the strong layers depends on the chemistries used, such as the electrodes and electrolyte and cycling power. For example for lithium metal in non-aqueous batteries it can be about 0.5 mm, and for sulfur in non-aqueous batteries it can be about 0.2 mm, and for zinc electrodes in aqueous batteries it can be about 1 mm.

In an embodiment when two identical mechanically strong layers are used; each mechanically strong layer has a periodic pattern of apertures, made by dry methods (such as laser cutting, die cutting, drilling, punching or etc.) or by wet methods (such as electro-spinning, molding, injection molding, casting or etc.). In an embodiment, the two mechanical layers are offset such that the apertures of one layer do not have any overlaps (such that there is no straight line between passing through the separator without hitting at least one of the layers). The ionic resistance of the layers can be different. In some embodiments the apertures of one mechanically strong layer are bigger than the other layer but the number of apertures is the same. In another embodiment the aperture sizes are the same but one layer has more apertures than the other mechanically strong layer. At least one low ionic resistance layer may be used forming the outer side of the separator bag; in addition a low ionic resistance layer may be used between the two strong layers; or even in the inner side of the bag facing the anode. In an embodiment, a low ionic resistance layer such as a nonwoven layer is placed between the perforated mechanically strong layers. In some embodiments, low ionic resistance layers such as nonwoven layers are also placed between the electrodes and the mechanically strong layers.

Electronically Insulating Layer

In embodiments, the insulator layer comprises a polymer, an oxide, a glass or a combination of these. In embodiments, the insulator is nonwoven or a woven. In an embodiment, the insulating layer is polymeric such as microporous or non-woven PE, PP, PVDF, polyester or polyimide. In a further embodiment the insulating layer is an oxide such as aluminum oxide. In an embodiment, said insulator comprises a coating provided on at least one side of said electronically conductive layer. As an example, an aluminum oxide layer is provided on an aluminum layer. In an embodiment, the insulator comprises one or more perforated or porous layers each independently having a porosity greater than or equal to 30%, from 30% to 80% or from 50% to 75%. In an embodiment, one or more perforated or porous layers each independently have a thickness selected over the range of 20 nm to 1 mm, from 1 µm to 500 µm or from 5 µm to 100 µm. In an embodiment, the separator comprises a first insulating layer having a plurality of apertures arranged in a first pattern and a second insulating layer having a plurality of apertures arranged in a second pattern; wherein said second pattern has an off-set alignment relative to said first pattern such that an overlap of said apertures of said first insulating layer and said apertures of said second insulating layer along axes extending perpendicularly from said first insulating layer to said second insulating layer is less than or equal to 20% In an embodiment, there is no overlap of the apertures.

Electronically Conductive Layer

In some embodiments the inner layer of the separator-bag is electronically conductive to enhance the performance (for example a porous or perforated conductive polymer, aluminum, carbon, tin, Ni, Fe, Cu, or stainless steel forming the most inner layer of the separator-bag). In embodiments, said electronically conductive layer comprises a chemically resistant material, a heat resistant material, a mechanically resistant material or any combination of these. In an embodiment, the conductive layer comprises a metal, alloy, carbon or a conductive polymer. In an embodiment, the electronically conductive layer comprises a metal foil, a metallic thin film, an electronically conductive polymer, a carbonaceous material or a composite material of any of these. In an embodiment, the metal or alloy is selected from Al, Cu, It, Ni, Fe, stainless steel, Sn, Si, Au, Pt, Ag, Mn, Pub and their alloys and Zircalloy, Hastalloy, and superalloys. In an embodiment, the electronically conductive layer comprises a metal selected from the group consisting of Al, Ti, Cu, stainless steel, Ni, Fe, and any alloys or composites thereof. In an embodiment, the electronically conducting polymer is selected from the linear-backbone "polymer blacks" (polyacetylene, polypyrrole, and polyaniline) and their copolymers, poly(p-phenylene vinylene) (PPV) and its soluble derivatives and poly(3-alkylthiophenes. In an embodiment, the electronically conducting layer does not react chemically or electrochemically with the electrolyte. In an embodiment, electronically conductive layer comprises a metal reactive with an active material of the negative or positive electrode. In an embodiment, the electronically conductive layer comprises a metal selected from the group consisting of Al and Sn. In embodiments, the thickness of the electronically conductive layer is greater than zero and less than 1 mm, greater than zero and less than 0.02 mm, from 0.001 mm to 1 mm, from 0.005 mm to 0.5 mm, from 0.05 mm to 0.1 mm or from 0.075 mm to 0.2 mm. In an embodiment, the composite separator further comprises one or more additional electronically conductive layers.

In another embodiment, the electronically conductive layer or a coating on the electronically conductive layer provides a source of active ions. For example, in a lithium ion cells the electronically conductive layer may have a coating of lithium metal on it or may be made of lithium. The source of active ions is used to provide active ions to the cell, such as to compensate the ion loss or to make Li-ion cells with non-lithiated electrodes.

Solid Electrolyte

In an embodiment, the solid electrolyte can be a free standing layer or a coating layer. In another embodiment, the solid electrolyte is in the form of particles or fibers filling the holes-pores of an insulator layer or the electronically conductive layer. A variety of solid electrolytes are known to the art and include, but are not limited to PEO, LIPON, LISICON (Lithium super ionic conductor, $Li_{2+2x}Zn_{1-x}GeO_4$), NASICON, and LIPON.

Negative Electrode

In an embodiment where the cell is a lithium ion cell, the active material of the negative electrode is lithium metal, a lithium alloy, silicon, a silicon alloy, silicon-graphite or graphite. In an embodiment where the cell is a zinc cell, the anode material is Zn metal, ZnO or Zn—ZnO. In an embodiment, the electrode is formed of particles of active material in a binder material. In an embodiment, the negative electrode comprises an active material in electronic communication with a current collector. In an embodiment, the current collector comprises an external connection tab; in an embodiment the external connection tab is integral with the current collector. In an embodiment, the current collector is an electronically conductive material such as a metal.

Positive Electrode

In embodiments where the cell is a lithium ion cell, the active material of the positive electrode is NMC (lithium nickel-manganese-cobalt oxide), sulfur, sulfur-carbon, CFx, carbon-air, LCO (lithium cobalt oxide, $LiCoO_2$) or LFP (lithium iron phosphate, $LiFePO_4$). In embodiments where the cell is a zinc battery, the cathode material is graphite, NiOOH, Ag, or AgO. In an embodiment, the electrode is formed of particles of active material in a binder material. In an embodiment, the positive electrode comprises an active material in electronic communication with a current collector. In an embodiment, the current collector comprises an external connection tab; in an embodiment the external connection tab is integral with the current collector. In an embodiment, the current collector is an electronically conductive material such as a metal.

Electrolyte

In embodiments, the electrolyte is a liquid electrolyte, gel electrolyte, polymer electrolyte or ceramic electrolyte. In embodiments, the electrolyte is aqueous or nonaqueous. When the electrochemical cell is a lithium ion battery, the electrolyte is preferably nonaqueous. In an embodiment, the electrolyte comprises one or more lithium salts dissolved in a nonaqueous solvent.

Exemplary Composite Separator Configurations

FIG. 1 is a schematic cross-sectional view of an electrode (10) completely enclosed by separator enclosure (20). As shown, the separator enclosure includes a first perforated mechanically strong layer (31) and a second perforated mechanically strong layer (32). In an embodiment, first perforated mechanically strong layer (31) is in physical contact with external surface (25) of said electrode (10). In an embodiment, separator enclosure (20) generates a contact force on at least a portion of said external surface (25) of said electrode (10), for example, a contact force sufficient to prevent a substantial change in the electrode porosity or surface roughness of at least a portion of the electrode.

Figure 2:
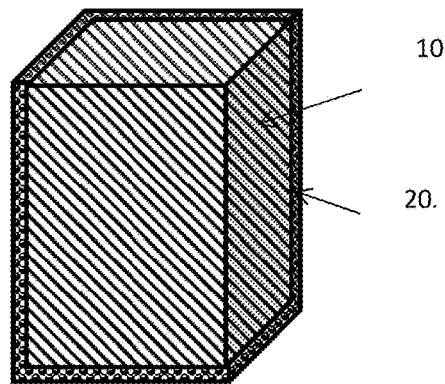
FIG. 2. Separator enclosure comprising a separator-bag, covering the electrode.

FIG. 2 is a perspective view of a separator enclosure (20) covering several faces of an electrode (10).

Figure 3:
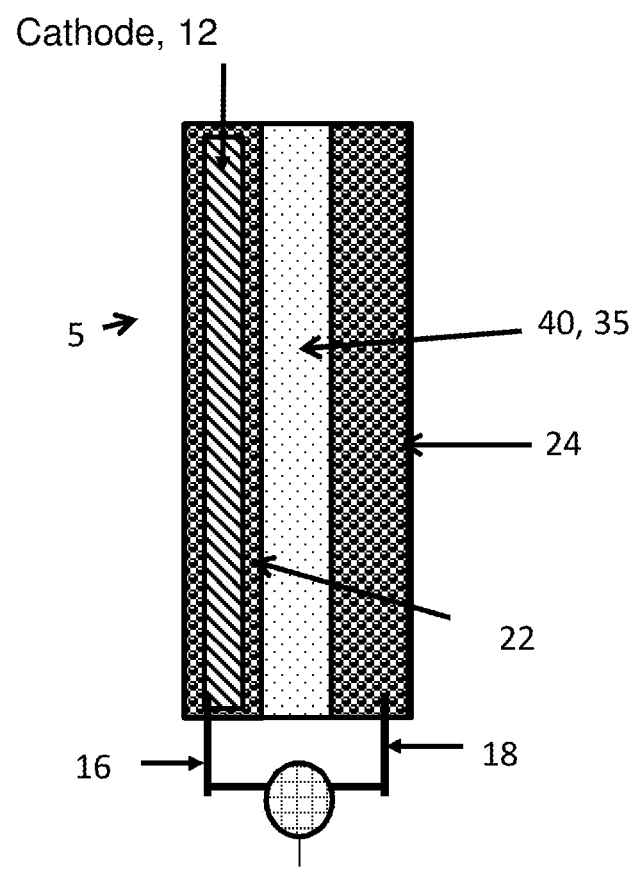
FIG. 3. Electrochemical cell with electrolyte between separator enclosures comprising separator bags, and opposite electrodes.
Figure 4:
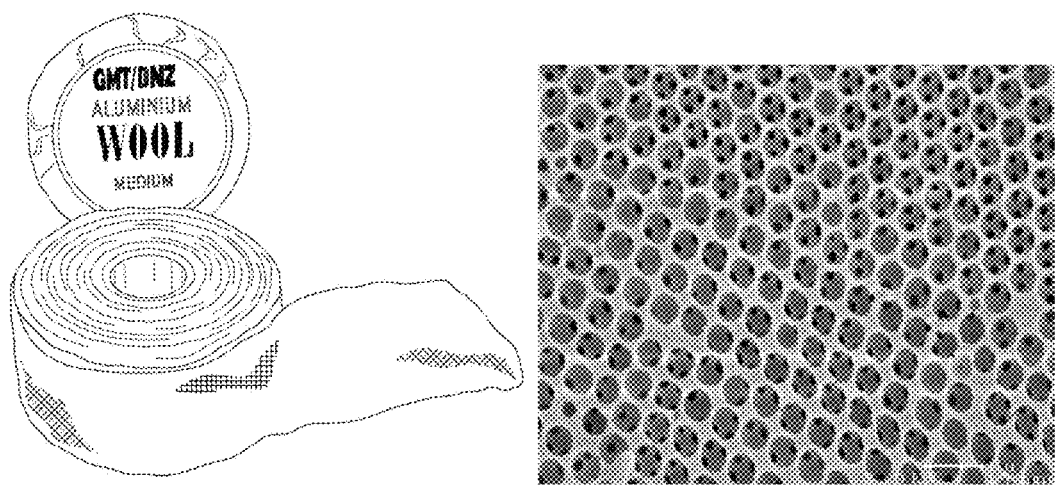
FIG. 4. Porous metal structure Anode.

FIG. 3 is a schematic cross-sectional view of an electrochemical cell (5) in which each electrode is enclosed in a separator bag. The cathode separator bag (22) has been cut away to show the cathode (12). The anode separator bag (24) encloses the anode (the anode is not explicitly in FIG. 3 show but is provided within anode separator bag 24)). An electronically insulating layer (40) is present between the cathode and anode separator enclosures; electrolyte is also present between the two separator enclosures. The cathode external connection tab (16) and anode external connection tab (18) are also shown. In an embodiment, element 50 in the circuit is a voltage source.

A separator bag used for a silicon anode may improve the performance and cycle life significantly by keeping the electrode material coherent and hindering active material (including electrolyte) loss. As an example, at least the inner layer facing the electrode (such as silicon, Zn, ZnO, Li, Al, Mn or Fe) can be made of Poly(3,4-ethylenedioxythiophene) (PEDOT), polyaniline (PANi), sodium carboxymethyl cellulose, elastomers, polymers, ceramic powders adhered by binders or polymers, or any of the materials named in this disclosure.

This invention is further explained with the following embodiments, which are not intended to limit the scope of this invention.

Example 1: Electrode Confinement in a Separator Cloth

A novel separator for electrochemical cells is introduced. An example is such that the separator covers at least the entire surface of an electrode facing the opposite electrode.

In some embodiments the separator can have a closed geometry such that it can cover all the surfaces of an electrode. In some embodiments the separators can apply pressure on at least one surface of an electrode. The applied pressure can improve the performance of the cell such as cycle life, e.g., by maintaining sufficient contact between the cell components. For example, the applied pressure is very helpful in cycling metal based electrodes such as lithium metal, zinc metal, ZnO or silicon anode. The applied pressure is also helpful to prevent material loss of the electrode, for example the applied pressure can help with the uniformity of the electrode, such as providing an electrode having a substantially uniform thickness (e.g., deviations from an average thickness of less than or equal to 20% and optionally less than or equal to 10%). One example can be in batteries such as lead acid batteries or lithium batteries or alkaline batteries (e.g. Zinc batteries) that the applied pressure can hinder the shape change of the electrode and thus improves the performance and cycle life. The applied pressure by the separator bag can result in uniform and smooth electrode surfaces during cycling. If the separator is a closed geometry that contains the electrode the applied pressure can be due to the elastic or super-elastic behavior of the separator. If the separator only covers part of the electrode then the applied pressure can be the result of the pressure of the separator on one side of the electrode and the pressure from the current collector or other cell components from the other side of the electrode, and can be due to the fixed volume of the cell.

The amount of pressure from the separator on the electrode can vary during the charge and discharge, depending on the chemistry of reactions and materials, structure, applied current-voltage and other factors, and thus careful design to consider the changes is recommended. As an example for lithium metal electrodes, enough pressure should be kept during plating lithium on the electrode to insure proper electroplating needed for improved performance and cycle life.

Separator itself can be made of at least two layers with different properties or structure. As an example the separator can be made of at least one mechanically strong layer for the support and at least one highly porous and low resistance layer for providing good conductivity. The mechanically strong layer provides the pressure needed for the electrode to improve performance; the highly porous layer provides the electrolyte contact between the electrode surfaces, needed to decrease the cell resistance. As an example the strong layer can be made of polymers, metals, alloys, ceramics, silicone, PET, PE, PP, PEEK, PVDF, Polysulfone, Kapton®, Polyester, Mylar®, polyurethanes, PVC, fiberglass, high melting temperature and mechanically robust layers or any of their combinations, and the porous layer can be made of nonwoven polyolefins. Experiments are done with perforated sheets of 0.025 mm made of silicone, PET, PE, PP, PEEK, Polysulfone, Kapton®, Polyester or Mylar® and Hirose 06HOP-2 nonwoven; and lithium metal batteries, lithium ion batteries and zinc metal batteries are tested, other alkaline batteries and lead-acid batteries will be tested soon. In another example the same materials were used but two identical mechanically strong layers were used; each mechanically strong layer had a periodic pattern (0.5 mm diameter with 1 mm pitch) of apertures, made by dry methods (such as laser cutting, die cutting, drilling, punching or etc.) or by wet methods (such as electro-spinning, molding, injection molding, casting or etc.); the two mechanical layers had an offset such that the apertures of one layer did not have any overlaps; a nonwoven layer was placed between the perforated mechanically strong layers; in some experiments nonwoven layers were also placed between the electrodes and the mechanically strong layers. The ionic resistance of the layers can be different. In some other experiments the apertures of one mechanically strong layer were bigger than the other layer but the number of apertures was the same. In another experiment the aperture sizes were the same but one layer had more apertures than the other mechanically strong layer.

It is important to realize that current state of the art electrochemical cells use conventional metallic sheets as current collectors and separators such as Celgard® thus can NOT apply the same level of pressure that our design can do, under the same conditions.

The size of the holes in the strong layers depends on the chemistries used, such as the electrodes and electrolyte and cycling power. For example for lithium metal in non-aqueous batteries it can be about 0.5 mm, and for sulfur in non-aqueous batteries it can be about 0.2 mm, and for zinc electrodes in aqueous batteries it can be about 1 mm.

In some embodiments at least one separator bag can be used in an electrochemical cell. As an example in an electrochemical cell the separator consists of a separator-bag for the anode and the separator itself can consist of more than one layer; for example the separator-bag can be made of a strong porous or perforated layer (such as polyester films with 40% holes, hole sizes can also be from nanometers to millimeters) covering the entire anode surface and a low resistant layer (such as nonwoven polyolefins) on the outer side away from the anode, facing the rest of the cell and the cathode.

In another example the above separator-bag can have two strong layers with holes that are offset with respect to each other such that there is no straight line between passing through the separator without hitting at least one of the layers; again at least one low resistant layer can be used forming the outer side of the separator bag; in addition a low resistant layer can be used between the two strong layers; or even in the inner side of the bag facing the anode.

In some experiments, any of the electrodes can have a separator-bag as described, for example in a lithium-sulfur battery. Or silicon based anode lithium-ion batteries or air batteries.

The idea of separator-bag (can also be called the shell separator) is believed to significantly enhance the performance of the electrochemical cell. The materials used to make the separator bags can depend on the electrode material, electrolyte and the performing conditions (such as cycle rate and environmental conditions such as temperature or pressure). One example is that the separator-bags if used with sulfur cathode can prolong the cell cycle life and improve the performance by hindering the material escape (here polysulphides) from the sulfur cathode, while accommodating the shape change during cycling.

Separator bag used for silicon anode also improves the performance and cycle life significantly by keeping the electrode material coherency and hindering active material (including electrolyte) loss. As an example, at least the inner layer facing the electrode (such as silicon, Zn, ZnO, Li, Al, Mn or Fe) can be made of PEDOT, PANi, sodium carboxymethyl cellulose, elastomers, polymers, ceramic powders adhered by binders or polymers, or any of the materials named in this letter).

In some embodiments the inner layer of the separator-bag is electronically conductive to enhance the performance (for example a porous or perforated conductive polymer, aluminum, carbon, tin, Ni, Fe, Cu, or stainless steel forming the most inner layer of the separator-bag).

The separator bag dimensions depend on the electrode size, preferably the separator inner surface area should be the same as the electrode surface area or slightly larger; the separator bag thickness can be the same as conventional separators, for example about 0.025 mm for lithium batteries, about 0.1 mm for alkaline batteries and about 1 mm for lead-acid batteries.

Another benefit of the separator bag invention is the reduction in the required binder in the electrode, which itself results in higher percentage of active materials and thus higher energy and power density at a lower cost.

Note that in electrode designs wherein the dominant contact between electrode media and current collector is through a facial area (e.g. a flat foil); a common performance decay mechanism is delamination which results in at least partial increase in electronic resistivity. Use of a separator bag mitigates this and related effects.

The separator bag in some embodiments can be made of conventional separator materials (such as micro-porous PE, PP, polyester or polyimide materials) or solid or polymer electrolytes (e.g., LISICON, PEO, PAN, LIPON).

Example 2: Separators for Electrodes and Electrochemical Cells

A novel separator for electrochemical cells is introduced such that the separator covers the entire surface of an electrode facing the opposite electrode In some embodiments the separators cab apply pressure on at least one electrode. The applied pressure can improve the performance of the cell such as cycle life. For example, the applied pressure is very helpful in cycling metal based electrodes such as lithium metal and zinc metal. The applied pressure is also helpful to prevent material loss of the electrode, for example the applied pressure can help with the uniformity of the electrode. One example can be in batteries such as lead acid batteries or lithium batteries or alkaline batteries (e.g. Zinc batteries) that the applied pressure can hinder the shape change of the electrode and thus improves the performance and cycle life. The applied pressure by the separator can result in uniform and smooth electrode surfaces during cycling. If the separator is a closed geometry that contains the electrode the applied pressure can be due to the elastic or super-elastic behavior of the separator. If the separator only covers part of the electrode then the applied pressure can be the result of the pressure of the separator on one side of the electrode and the pressure from the current collector from the other side of the electrode, and can be due to the fixed volume of the cell.

The pressure from the separator on the electrode can vary during the charge and discharge. As an example for lithium metal electrodes, the pressure can be higher during plating lithium on the electrode to insure better electroplating needed for improved performance and cycle life.

Separator itself can be made of at least layers with different properties or structure. As an example the separator can be made of at least one mechanically strong layer for the support and at least one highly porous and low resistance layer for providing good conductivity. The mechanically strong layer provides the pressure needed for the electrode to improve performance; the highly porous layer provides the electrolyte contact between the electrode surfaces, needed to decrease the cell resistance. As an example the strong layer can be made of silicone, PET, PE, PP, PEEK, Polysulfone, Kapton, Polyester, Mylar, PVC, fiberglass or any other high melting temperature and mechanically robust layer, and the porous layer can be made of nonwoven polyolefins. Experiments are done with perforated sheets of 0.025 mm made of silicone, PET, PE, PP, PEEK, Polysulfone, Kapton, Polyester or Mylar and Hirose 06HOP-2 nonwoven; and lithium metal batteries, lithium ion batteries and zinc metal batteries are tested, other alkaline batteries and lead-acid batteries will be tested soon. In another example the same materials were used but two identical mechanically strong layers were used; each mechanically strong layer had a periodic pattern (0.5 mm diameter with 1 mm pitch) of apertures, made by dry methods (such as laser cutting, die cutting, drilling, punching or etc.) or by wet methods (such as electro-spinning, molding, injection molding, casting or etc.); the two mechanical layers had an offset such that the apertures of one layer did not have any overlaps; a nonwoven layer was placed between the perforated mechanically strong layers; in some experiments nonwoven layers were also placed between the electrodes and the mechanically strong layers. In some other experiments the apertures of one mechanically strong layer were bigger than the other layer but the number of apertures was the same. In another experiment the aperture sizes were the same but one layer had more apertures than the other mechanically strong layer.

It is important to mention that the effect of pressure is very important in this design, allowing a smoother surface with fewer irregularities, on the electrodes. We think the effect of pressure is due to the enforcement of the designed path (tortuosity) rather than the mechanical pressure itself; thus there exist an optimum pressure range in which the best cell performance (smooth deposition on electrodes in addition to cycle life and rate capability) can be obtained. It is important to realize that current state of the art separators such as Celgard are microporous and thus can NOT apply the same level of pressure that our design can do, under the same conditions. It is noteworthy to mention that very high pressure can result in a non-working condition, for example by disrupting the electrolyte covering all surfaces of any of the electrodes.

The size of the holes in the strong layers depends on the chemistries used, such as the electrodes and electrolyte and cycling power. For example for lithium metal in non-aqueous batteries it can be 0.5 mm-1 mm, and for sulfur in non-aqueous batteries it can be 0.2 mm, and for zinc electrodes in aqueous batteries it can be 1-2 mm.

In some embodiments at least one separator can be used. As an example in an electrochemical cell the separator consists of a separator-bag for the anode and the separator itself can consist of more than one layer; for example the separator-bag can be made of a strong porous or perforated layer (such as Mylar® film with 40% holes, hole sizes can be from nanometers to millimeters) covering the entire anode surface and a low resistant layer (such as nonwoven polyolefins) on the outer side away from the anode, facing the rest of the cell and the cathode.

In another example the above separator-bag can have two strong layers with holes that are offset with respect to each other such that there is no straight line between passing through the separator without hitting at least one of the layers; again at least one low resistant layer can be used forming the outer side of the separator bag; in addition a low resistant layer can be used between the two strong layers; or even in the inner side of the bag facing the anode.

In some experiments, any of the electrodes can have a separator-bag as described, for example in a lithium-sulfur battery. Or silicon based anodes.

The idea of separator-bag (can also be called the shell separator) is believed to significantly enhance the performance of the electrochemical cell. The materials used to make the separator bags can depend on the electrode material, electrolyte and the performing conditions (such as cycle rate and environmental conditions such as temperature or pressure). One example is that the separator-bags if used with sulfur cathode can prolong the cell cycle life and improve the performance by hindering the material escape (here polysulfides) from the sulfur cathode, while accommodating the shape change during cycling, the shape change accommodation can be accomplished by a rigid separator bag that has the larger size needed during cycling (for example made of TiO2 or SiO2) or by a flexible separator bag (for example made of silicone).

Separator bag used for silicon anode also improves the performance and cycle life significantly by keeping the electrode material coherency and hindering active material loss. As an example, the inner layer facing the silicon can be made of PEDOT, PANi, sodium carboxymethyl cellulose or any of the materials named here).

In some embodiments the inner layer of the separator-bag is electronically conductive to enhance the performance (for example a porous or perforated conductive polymer, aluminum, carbon, tin or stainless steel forming the most inner layer of the separator-bag).

The separator bag dimensions depend on the electrode size, preferably the separator inner surface area should be the same as the electrode surface area or slightly larger; the separator bag thickness can be the same as conventional separators, for example about 0.025 mm for lithium batteries, about 0.1 mm for alkaline batteries and about 1 mm for lead-acid batteries.

The separators mentioned here can be used for batteries, fuel cells, flow batteries, supercapacitors, ultracapacitors, or even as membranes in filtration industries such as food, medical, oil, gas, water, etc.

Another example is a rechargeable lithium metal battery with lithiated cathode. The lithium metal anode is separated from the cathode with a porous-perforated elastomer (such as silicone, rubber or elastic electrode binder materials known in the art, e.g., styrene-butadiene (ST-BD) copolymer and 2-ethylhexyl acrylate-acrylonitrile (2EHA-AN) copolymer, acryloxy perfluoropolyether, alginate, polyurethane) and is made in the discharged mode that has the minimum thickness (e.g., current collector thickness and possibly a thin layer of lithium that performs as the substrate for lithium deposition during charging). This way upon charging the lithium deposition results in compressive stress in the porous-perforated elastomer which itself applies pressure on the newly deposited lithium and thus improves the performance of the electrode and electrochemical cell. The cell also has an electrolyte and can further have a separator (conventional separators or those described in US Patent Publication 2013/0017432); the electrolyte can be aqueous, non-aqueous, polymer or solid electrolyte such as those known in the art; electrolyte (liquid, gel, polymer or solid) occupies the pores-apertures of the said elastomer layer.

Notes: It is important to mention that the effect of pressure is important in these designs, allowing a smoother surface with fewer irregularities, on the electrodes. The effect of pressure may be due to the change of the free energy; however, as too much pressure may reduce the ionic conductivity of the pores in the separator layers or even electrodes, thus, there exist an optimum pressure range in which the best cell performance (smooth deposition on electrodes in addition to cycle life and rate capability) can be obtained. It is noteworthy to mention that very high pressure can result in a degradation of performance, for example by hindering the electrolyte from covering the entire surface of any of the electrodes. Any of the mentioned inventions can further be combined with one or more of the other inventions described here such as the separator bag invention to enhance the cyclic performance of an electrochemical cell. The methods mentioned here can be used for batteries, fuel cells, flow batteries, supercapacitors, ultracapacitors, or even as membranes in filtration industries such as food, medical, oil, gas, water, etc.

Another invention is solid electrolytes and electrochemical cells (such as lithium batteries, aluminum batteries, air batteries, alkaline batteries, fuel cells, flow batteries, semi-solid batteries and so on) made with them in which the solid electrolyte powders (such as NASICON, LISICON type ceramic electrolytes) are adhered to each other using a binder (such as PVDF, PTFE or other binders known in the art) to make flexible, long-life, no-hole and low cost solid electrolytes and without the need of high temperature fabrication. Current solid electrolytes are made with powders treated at very high temperatures which results in very expensive solid electrolytes which have to be thick to avoid pinholes and fragility. The high thickness results in higher ionic conductivity and no-deformability which makes them impractical in industrial applications. Further our novel method allows using different new materials such as LTO powder as components of the solid electrolyte. The amount of the binder can be about 5-10%. A solvent (organic based or water based or any other solvent) can be used to glue the powders to each other.

STATEMENTS REGARDING INCORPORATION BY REFERENCE AND VARIATIONS

All references cited throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

US Patent Publication 2013/0017432 relating to separators for electrochemical systems is hereby incorporated by reference in its entirety.

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention as defined by the appended claims. The specific embodiments provided herein are examples of useful embodiments of the present invention and it will be apparent to one skilled in the art that the present invention may be carried out using a large number of variations of the devices, device components, methods steps set forth in the present description. As will be obvious to one of skill in the art, methods and devices useful for the present methods can include a large number of optional composition and processing elements and steps.

When a group of substituents is disclosed herein, it is understood that all individual members of that group and all subgroups, including any isomers, enantiomers, and diastereomers of the group members, are disclosed separately. When a Markush group or other grouping is used herein, all individual members of the group and all combinations and subcombinations possible of the group are intended to be individually included in the disclosure. When a compound is described herein such that a particular isomer, enantiomer or diastereomer of the compound is not specified, for example, in a formula or in a chemical name, that description is intended to include each isomers and enantiomer of the compound described individual or in any combination. Additionally, unless otherwise specified, all isotopic variants of compounds disclosed herein are intended to be encompassed by the disclosure. For example, it will be understood that any one or more hydrogens in a molecule disclosed can be replaced with deuterium or tritium. Isotopic variants of a molecule are generally useful as standards in assays for the molecule and in chemical and biological research related to the molecule or its use. Methods for making such isotopic variants are known in the art. Specific names of compounds are intended to be exemplary, as it is known that one of ordinary skill in the art can name the same compounds differently.

It must be noted that as used herein and in the appended claims, the singular forms "a", "an", and "the" include plural reference unless the context clearly dictates otherwise. Thus, for example, reference to "a cell" includes a plurality of such cells and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are now described. Nothing herein is to be construed as an admission that the invention is not entitled to antedate such disclosure by virtue of prior invention.

Every formulation or combination of components described or exemplified herein can be used to practice the invention, unless otherwise stated.

Whenever a range is given in the specification, for example, a temperature range, a time range, or a composition or concentration range, all intermediate ranges and subranges, as well as all individual values included in the ranges given are intended to be included in the disclosure. As used herein, ranges specifically include the values provided as endpoint values of the range. For example, a range of 1 to 100 specifically includes the end point values of 1 and 100. It will be understood that any subranges or individual values in a range or subrange that are included in the description herein can be excluded from the claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

I claim:

1. An electrochemical cell comprising:
   a positive electrode;
   a negative electrode;
   one or more electrolytes positioned between said positive electrode and said negative electrode; wherein said one or more electrolytes are capable of conducting charge carriers; and
   an electrically insulating and ionically conductive separator enclosure enclosing an entire surface of said positive electrode or said negative electrode that is not in physical contact with a current collector, wherein said separator enclosure generates a contact force, characterized by an average contact pressure selected from the range of 10 Pa to 10 MPa, on said entire surface of said positive electrode or said negative electrode during charging or discharging of said electrochemical cell; wherein said contact force is sufficient to prevent a substantial change in the electrode porosity or surface roughness of said positive electrode or said negative electrode enclosed by said separator enclosure during cycling of said electrochemical cell.

2. The electrochemical cell of claim 1, wherein said contact force is sufficient to increase the cycle life of said electrochemical cell by a factor of at least 2.

3. The electrochemical cell of claim 1, wherein said contact force is sufficient to prevent a substantial loss equal to or greater than 20% of active mass after each 500 full cycles or more of active material of said positive electrode or said negative electrode enclosed by said separator enclosure during cycling of said electrochemical cell.

4. The electrochemical cell of claim 1, wherein said contact force is sufficient to limit the increase in surface roughness to less than or equal to 200% after 500 full cycles.

5. The electrochemical cell of claim 1 wherein the change in surface roughness per cycle is less than 0.2%, as averaged over 10 cycles.

6. The electrochemical cell of claim 1, wherein said contact force is sufficient to limit the change in electrode porosity to less than or equal to 20% after each 500 full cycles or more.

7. The electrochemical cell of claim 1, wherein said contact force is sufficient to limit the change in electrode porosity per cycle to less than 0.1%, as averaged over 10 cycles.

8. The electrochemical cell of claim 1, wherein said contact force is generated by an elastic force of the separator enclosure provided in an expanded state, and varies as a function of the state of charge and state of health of the battery.

9. The electrochemical cell of claim 1, wherein said separator enclosure entirely encloses said positive electrode or said negative electrode.

10. The electrochemical cell of claim 1, wherein said enclosure separator is in physical contact with an active material of said positive electrode or said negative electrode enclosed by said separator enclosure or is in physical contact with an intermediate structure provided between an active material of positive electrode or said negative electrode and said enclosure separator.

11. The electrochemical cell of claim 1, wherein said contact force is characterized by an average contact pressure selected from the range of 1 kPa and 100 kPa.

12. The electrochemical cell of claim 1, wherein said enclosure separator comprises one or more perforated or porous layers each independently having a porosity greater than or equal to 30%.

13. The electrochemical cell of claim 1, wherein said enclosure separator comprises one or more high mechanical strength layers.

14. The electrochemical cell of claim 1 wherein said enclosure separator comprises one or more low ionic resistance layers each independently having a JIS Gurley number less than or equal to 2000 seconds.

15. The electrochemical cell of claim 1, wherein said enclosure separator comprises one or more layers independently comprising an elastomer.

16. The electrochemical cell of claim 1, wherein said enclosure separator comprises a chemical barrier capable of preventing transport of one or more reaction products from said negative electrode or said positive electrode to said electrolyte.

17. The electrochemical cell of claim 1, wherein said enclosure separator comprises a first high mechanical strength layer and a low ionic resistance layer.

18. The electrochemical cell of claim 1, wherein said positive or negative electrode enclosed by said separator enclosure is a metal electrode.

19. The electrochemical cell of claim 1, wherein said positive or negative electrode enclosed by said separator enclosure is a zinc electrode, lithium electrode, ZnO electrode, a silicon electrode, a germanium electrode, a sulfur electrode, an air electrode, a fluorinated electrode, or a carbonaceous electrode.

20. The electrochemical cell of claim 1, wherein said positive electrode or said negative electrode enclosed by said separator enclosure is an intercalation electrode.

21. The electrochemical cell of claim 1, wherein at least a portion of the porosity of one of the layers of the said separator enclosure of the said electrochemical cell is filled with a solid filler, wherein the solid filler comprises a polymer, ceramic or glass electrolyte.

22. An electrochemical cell comprising:
a positive electrode;
a negative electrode;
one or more electrolytes positioned between said positive electrode and said negative electrode; wherein said one or more electrolytes are capable of conducting charge carriers; and
an electrically insulating and ionically conductive separator enclosure enclosing an entire free surface of said positive electrode or said negative electrode, wherein said separator enclosure generates a contact force on the entire free surface of said positive electrode or said negative electrode; wherein said contact force is sufficient to prevent a substantial change in the electrode porosity or surface roughness of said positive electrode or said negative electrode enclosed by said separator enclosure during cycling of said electrochemical cell; wherein said enclosure separator comprises a first layer having a plurality of apertures arranged in a first pattern and a second layer having a plurality of apertures arranged in a second pattern; wherein said second pattern has an off-set alignment relative to said first pattern such that an overlap of said apertures of said first layer and said apertures of said second layer along axes extending perpendicularly from said first layer to said second layer is less than or equal to 20%.

* * * * *